US009037977B1

(12) United States Patent
Tovino et al.

(10) Patent No.: US 9,037,977 B1
(45) Date of Patent: May 19, 2015

(54) SIMULATED COMMUNICATION

(75) Inventors: Michael S. W. Tovino, Bend, OR (US);
Glen K. Okita, Los Altos, CA (US);
Meigy Tsai, San Jose, CA (US); Florin Micle, San Jose, CA (US)

(73) Assignee: ShoreTel, Inc., Sunnyvale, CA (US)

( * ) Notice: Subject to any disclaimer, the term of this patent is extended or adjusted under 35 U.S.C. 154(b) by 275 days.

(21) Appl. No.: 13/069,042

(22) Filed: Mar. 22, 2011

(51) Int. Cl.
*G06F 17/00* (2006.01)
*G06F 17/50* (2006.01)

(52) U.S. Cl.
CPC .................. *G06F 17/5009* (2013.01)

(58) Field of Classification Search
CPC .................. G06F 17/5009; G06F 17/5022
USPC ............... 715/734, 736; 379/201.02
See application file for complete search history.

(56) References Cited

U.S. PATENT DOCUMENTS

| | | | |
|---|---|---|---|
| 6,674,713 B1 | 1/2004 | Berg et al. | |
| 6,707,906 B1* | 3/2004 | Ben-Chanoch | 379/266.07 |
| 6,724,885 B1* | 4/2004 | Deutsch et al. | 379/265.02 |
| 8,126,994 B2* | 2/2012 | Richards | 709/223 |
| 8,233,609 B2* | 7/2012 | Noble, Jr. | 379/265.01 |
| 8,428,926 B2* | 4/2013 | Choquet | 703/11 |
| 8,769,032 B2 | 7/2014 | Ginevan et al. | |
| 2002/0120787 A1 | 8/2002 | Shapiro et al. | |
| 2002/0176384 A1* | 11/2002 | Chandra et al. | 370/335 |
| 2005/0213742 A1* | 9/2005 | Fukuzawa | 379/265.02 |
| 2006/0035632 A1 | 2/2006 | Sorvari et al. | |
| 2006/0041415 A1* | 2/2006 | Dybas et al. | 703/13 |
| 2007/0121894 A1* | 5/2007 | Noble, Jr. | 379/265.02 |
| 2008/0005290 A1 | 1/2008 | Nykanen et al. | |
| 2008/0086564 A1 | 4/2008 | Putman et al. | |
| 2008/0102810 A1* | 5/2008 | Lewis et al. | 455/423 |
| 2008/0133652 A1* | 6/2008 | Richards | 709/203 |
| 2008/0244613 A1 | 10/2008 | Parthasarathy et al. | |
| 2009/0003542 A1 | 1/2009 | Ramanathan et al. | |
| 2009/0003569 A1 | 1/2009 | Forbes et al. | |
| 2009/0077180 A1 | 3/2009 | Flowers et al. | |
| 2009/0282458 A1 | 11/2009 | Hjelm | |
| 2009/0307362 A1 | 12/2009 | Mendez et al. | |
| 2009/0307365 A1 | 12/2009 | Mackay et al. | |
| 2010/0208879 A1* | 8/2010 | Meriaz et al. | 379/201.02 |
| 2010/0217780 A1 | 8/2010 | Erola et al. | |

(Continued)

FOREIGN PATENT DOCUMENTS

WO 2007091089 8/2007
WO 2008107675 12/2008

OTHER PUBLICATIONS

Communigate Pro, "CommuniGate Pro From the IT Department's Perspective," 7 pages, retrieved on Apr. 12, 2011 from http://communigate.com/Papers/CGP_admin_view.pdf.
Communigate Pro, "Internet Communications Server, Email—Collaboration—VoIP," 1098 pages, retrieved on Apr. 12, 2011 from ftp://ftp.communigate.com/pub/cgpguide.pdf.

(Continued)

*Primary Examiner* — Daeho Song
(74) *Attorney, Agent, or Firm* — Patent Law Works LLP.

(57) ABSTRACT

A system for simulated communication is described. A simulator module generates simulated communication information. A Graphical User Interface module ("GUI module") generates graphical data based at least in part on the simulated communication information. The graphical data creates the appearance of an ongoing communication between a reserved agent and a third party user that is not yet occurring. The GUI module sends the graphical data to a display associated with the reserved agent device so that the display depicts a simulated communication.

22 Claims, 25 Drawing Sheets

(56) References Cited

U.S. PATENT DOCUMENTS

| | | |
|---|---|---|
| 2010/0310062 A1 | 12/2010 | Srinivasan et al. |
| 2011/0029923 A1 | 2/2011 | Xu et al. |
| 2011/0075828 A1 | 3/2011 | Okita et al. |
| 2011/0119377 A1 | 5/2011 | Patel et al. |
| 2011/0154222 A1 | 6/2011 | Srinivasan et al. |
| 2011/0261945 A1 | 10/2011 | Brock et al. |
| 2011/0296312 A1* | 12/2011 | Boyer et al. ............. 715/736 |
| 2012/0059892 A1 | 3/2012 | Ramanathan et al. |
| 2012/0096095 A1 | 4/2012 | Bhargava |
| 2012/0195305 A1 | 8/2012 | Chavda et al. |

OTHER PUBLICATIONS

Communigate Pro, "CommuniGate Pro Overview," 4 pages, retrieved on Apr. 12, 2011 from http://communigate.com/Papers/CGP_overview.pdf.

Communigate Pro, "CommuniGate Pro Carrier Suite: Rich Media Applications that drive subscriber retention & increase ARPU," 2 pages, retrieved on Apr. 12, 2011 from http://communigate.com/Papers/Solutions_Overview_Enterprise_Datasheet. pdf.

Communigate Pro, "CommuniGate Pro Enterprise Suite: Rich Media Internet Communications to boost effective business communications," 2 pages, retrieved on Apr. 12, 2011 from http://communigate.com/Papers/Solutions_Overview_Enterprise_Datasheet. pdf.

* cited by examiner

1000

1100

1200

SIMULATED COMMUNICATION

INCORPORATION BY REFERENCE

This application is related to the following U.S. utility application, which is hereby incorporated by reference: Ser. No. 12/985,326, filed on Jan. 5, 2011 and entitled "UNIFIED COMMUNICATION."

This application is also related to the following U.S. provisional patent application, which is hereby incorporated by reference: Ser. No. 61/365,262, filed on Jul. 16, 2010 and entitled "UC CLIENT APPLICATION SERVER (CAS) ARCHITECTURE & API."

BACKGROUND OF THE INVENTION

1. Field of the Invention

The present invention relates to telephony systems such as those using Voice over Internet Protocol (VoIP). In particular, the present invention relates to simulating an inbound or outbound communication.

2. Description of the Background Art

Many businesses today have call centers systems that perform various functions. For example, a call center can handle customer services calls, make sales calls, etc. Communications are received at the call center. Sometimes these communications are terminated before a call center agent responds to the communication. For example, the call center is a customer service center that helps customers (i.e., third-party users of the call center system) with problems related to products or services sold by the business that runs the call center. A customer makes a telephone call to the customer service center. Before a customer service agent is able to take the customer's call, the customer hangs up. This is referred to herein as a "terminated communication." A terminated communication includes, among other things, telephone calls to the call center that are terminated (e.g., customer hangs up, mobile phone service disconnects, etc.), chat sessions to the call center that are terminated (e.g., loss of bandwidth, customer terminated chat session, etc.), etc. Existing call center systems have numerous problems dealing with terminated communications.

First, the call center wants to respond to all users who call the call center, including those that experience a terminated communication. However, existing call center systems do not provide a way to reconnect with users who have experienced a terminated communication.

Second, the call center wants to be responsive to various types of terminated communications received at the call center, including telephone calls, chats and emails. However, existing call center systems do not provide a way to reconnect with users who have experienced a terminated communication using these various different communication types.

Third, existing call center systems do not provide a familiar interface for reconnecting with users that have experienced a terminated communication.

SUMMARY OF THE INVENTION

The present invention overcomes the deficiencies and shortcomings of the prior art by providing a system, method and computer program product for simulated communication. The system of the present invention is particularly advantageous because it provides simulated communications. The system comprises a reservation module stored on a memory and communicatively coupled to a reserved agent. The reservation module is configured to generate simulated communication information, generate graphical data based at least in part on the simulated communication information. The graphical data creates the appearance of an ongoing communication between a reserved agent and a third party user that is not yet occurring. The reservation module sends the graphical data to a display associated with the reserved agent device so that the display depicts a simulated communication.

BRIEF DESCRIPTION OF THE DRAWINGS

The accompanying drawings illustrate several embodiments of the invention and, together with the description, serve to explain the principles of the invention. The invention is illustrated by way of example, and not by way of limitation in the figures of the accompanying drawings in which like reference numerals are used to refer to similar elements.

DETAILED DESCRIPTION OF THE PREFERRED EMBODIMENTS

Figure 1:
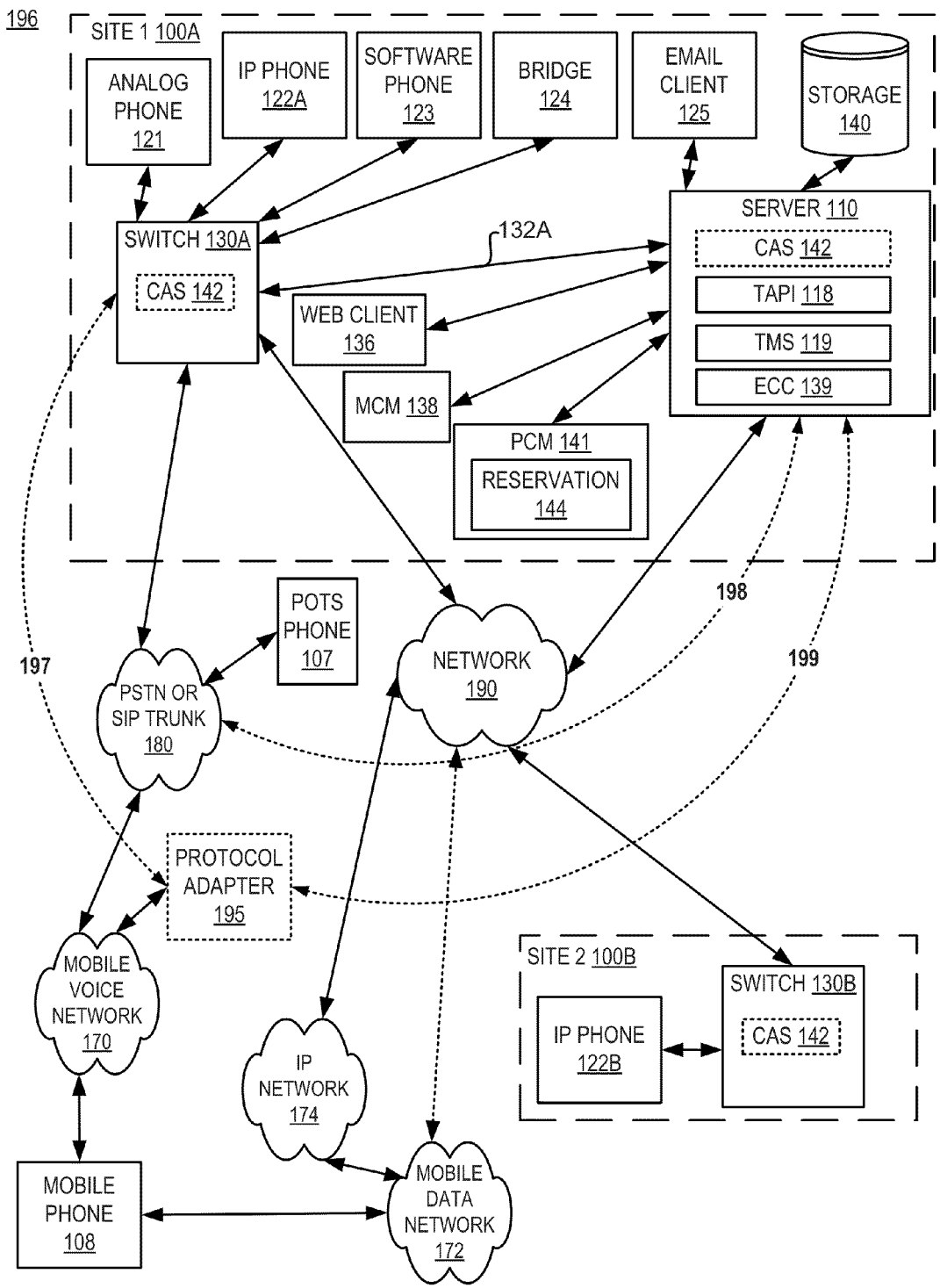
FIG. 1 is a high-level block diagram illustrating a distributed telephony system according to one embodiment of the present invention.

A system and method for simulating communications is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention. For example, the present invention is described in one embodiment below with reference to system operation and particular hardware. However, the present invention applies to any type of computing device that can receive a data and commands, and any peripheral devices providing services.

Although the examples given herein describe the present invention in embodiments applicable to telephony, a person having ordinary skill in the art will recognize that the present invention is applicable to other technologies.

Reference in the specification to "one embodiment" or "an embodiment" means that a particular feature, structure or characteristic described in connection with the embodiment is included in at least one embodiment of the invention. The appearances of the phrase "in one embodiment" in various places in the specification are not necessarily all referring to the same embodiment.

Some portions of the detailed descriptions that follow are presented in terms of algorithms and symbolic representations of operations on data bits within a non-transitory computer-readable memory. These algorithmic descriptions and representations are the means used by those skilled in the data processing arts to most effectively convey the substance of their work to others skilled in the art. An algorithm is here, and generally, conceived to be a self consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general-purpose computer selectively activated or reconfigured by a computer program stored in the computer. Such a computer program is stored on a non-transitory computer readable storage medium, such as, but is not limited to, a flash memory and/or any type of disk device including floppy disks, optical disks, CD-ROMs and magnetic optical disks, read-only memories (ROMs), random access memories (RAMs), EPROMs, EEPROMs, magnetic or optical cards, or any type of media suitable for storing electronic instructions, each coupled to a computer system bus.

Descriptions herein to a server include one or more of: (1) a hardware server; (2) a software server executed by a processor; (3) a software server stored on a non-transitory computer-readable memory; (4) a virtual server executed by a processor; and (5) a virtual server stored on a non-transitory computer-readable memory. In one embodiment, the server is configured to provide the functionality of a telephony switch.

Descriptions herein a switch refer to a telephony switch, and include one or more of: (1) a hardware telephony switch; (2) a software telephony switch executed by a processor; (3) a software telephony switch stored on a non-transitory computer-readable memory; (4) a virtual telephony switch executed by a processor; and (5) a virtual telephony switch stored on a non-transitory computer-readable memory. A hardware telephony switch is a hardware device configured to provide the functionality of a telephony switch. A virtual switch is a virtualized telephony switch.

All descriptions herein to modules include one or more of (1) computer code and routines stored on a non-transitory computer-readable memory and (2) a hardware device comprised of one or more circuit boards and/or a processor.

The FIGS. 1-5 include various lines with arrowheads. These lines are signal lines that indicate communicative coupling between the various elements they connect. In one embodiment, the signaling indicated in FIGS. 1-5 is implemented using Session Initiation Protocol ("SIP"), Computer Telephony Integration ("CTI") or the Call Application Server protocol ("CAS protocol") described in the U.S. patent application Ser. No. 12/985,326, the entirety of which is hereby incorporated by reference. In one embodiment, the signaling indicated in FIGS. 1-5 are implemented using a combination of one or of SIP, CTI, the CAS protocol and one or more other signaling protocols. SIP and CTI are known to persons having ordinary skill in the art.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

System Overview

An Enterprise Contact Center module ("ECC module") (e.g., element 139 in FIG. 1) communicates with a reservation module (e.g., element 144 in FIG. 1) to provide a call center system. The call center system simulates a communication to overcome the deficiencies present in the prior art. Simulating a communication includes, in one embodiment, detecting a communication. The detected communication is an inbound communication to the call center system or an outbound communication from the call center system (e.g., an inbound telephone call or chat from a third party user to a customer service call center or an outbound telephone call from a sales agent at the call center to a third party user that is a prospective customer).

The call center system tracks the communication (e.g., to determine if a telephone call is terminated before it is answered) and queues a "contact back communication" responsive to the tracking. In one embodiment, a contact back event is a communication to proactively reinitiate communication with a third-party user via any form of communication, including telephone calls, video conference calls, emails, chats, etc. The contact back event is described in further detail below with reference to the reservation module 144 and FIG. 3.

The call center system identifies an agent device associated with the call center that is available to participate in the contact back communication, reserves the available agent device and generates simulated communication information. In one embodiment, the call center identifies an extension associated with one or more agent devices that is available to participate in the contact back communication, reserves the agent device and generates the simulated communication information. One or more of the reserved agent device and the reserved extension are associated with a human user that is reserved to participate in the contact back event (i.e., the human user is a reserved agent). In one embodiment, the human user is a user of the agent device. The simulated communication information is call string information that is picked up by a graphics subsystem to generate a graphical user interface ("GUI") that is depicted on a display of an agent device used by the reserved agent. In one embodiment, the display depicts a simulated communication that indicates to the reserved agent that an incoming call is being made to the reserved agent device by the third party user. In one embodiment, the incoming call is a pending call that will be made to the reserved agent at a time in the future (e.g., 0.01 to 5.00 seconds in the future). For example, the GUI includes a call identifier (e.g., a TAPI string) that appears to be from a third party user. However, the incoming call is from the ECC application, and the call identifier is a simulated TAPI call string that indicates that the third party user is calling the reserved agent device when in fact there is not an incoming call from the third party user. This is referred to herein as a simulated call or a virtualized call since the call appears to be from a third party user when it is not.

The call center system generates and sends the GUI to the display of the reserved agent. The reserved agent then has the option to answer the simulated call. In some embodiments, the reserved agent does not have the option to answer the call. Different embodiments of the call center system are described below.

FIG. 1 illustrates a block diagram of a distributed telephony system 196, according to one embodiment of the present invention. The illustrated embodiment of telephony system 196 includes a first site 100A and a second site 100B. As used herein, a site 100 represents a grouping of resources. In the illustrated embodiment, the two sites 100A, 100B are communicatively coupled via a network 190. One skilled in the art will note that sites 100A, 100B can be physically distinct from each other or merely topology-related groupings that are not in physically distinct locations. The telephony system 196 in FIG. 1 is used only by way of example. While FIG. 1 illustrates two sites, the present invention applies to any system architecture having one or more sites. Furthermore, while only one network 190 is coupled to the sites 100A,100B in practice any number of networks 190 can be connected to the sites 100A, 100B.

In one embodiment of the present invention, the network 190 is a partially public or a wholly public network such as the Internet. The network 190 can also be a private network or include one or more distinct or logical private networks (e.g., virtual private networks, Wide Area Networks ("WAN") and/or Local Area Networks ("LAN")). Additionally, the communication links to and from the network 190 can be wireline or wireless (i.e., terrestrial- or satellite-based transceivers). In one embodiment of the present invention, the network 190 is an IP-based wide or metropolitan area network.

The software that supports the computer-integrated functionality of providing the above-described telephony services is generally implemented as a client-server environment in which the participants or clients (distributed telephony users) communicate with a server 110. Computer-integrated features rely not only on a server's application platform but also on the availability of the network 190 bandwidth that connects the switches 130A, 130B and the server 110.

In the illustrated embodiment, the switch 130A is coupled to the network 190. The switch 130A is also coupled to the server 110 via signal line 132A and to the Public Switched Telephone Network (PSTN) trunk 180 via an analog or digital trunk line (e.g., a T1 or E1 interface) or a Session Initiation Protocol ("SIP") trunk service provider. In the illustrated configuration, the switch 130A provides an interface for calls originating from or terminating on the PSTN or SIP trunk 180. The PSTN 180 is coupled to any number of Plain Old Telephone phone Service phone (POTS phone) 107, and a mobile voice network 170 coupled to any number of mobile phones represented by mobile phone 108. Thus, POTS phone 107 calls and mobile phone 108 calls can originate on the switch 130A via the PSTN 180. The mobile phone 108 is communicatively coupled to the mobile voice network 170 and a mobile data network 172. The mobile data network 172 is communicatively coupled to an Internet Protocol network 174 ("IP network 174"). The IP network 174 is communicatively coupled to the network 190. In one embodiment, the IP network 174 communicates indirectly with the switch 130A and/or the server 110 via the network 190.

The mobile voice network 170 is one or more cellular networks configured to transmit voice packets to different phones via the one or more cellular phone networks. For example, the mobile voice network 170 is one or more cellular telephone networks.

The mobile data network 172 is one or more wireless networks configured to transmit data such to different phones and/or networks. For example, the mobile data network 172 transmits text messages, instant messages, e-mail and data associated with browsing a network such as the Internet. In one embodiment, the mobile data network 172 is a 3G network. In another embodiment, the mobile data network 172 is a 4G network.

In one embodiment, the IP network 174 is a WAN or a similar data network. In another embodiment, the IP network 174 is an IP-based wide or metropolitan area network. The IP network 174 can also be a private network or include one or more distinct or logical private networks (e.g., virtual private networks or WANs). In one embodiment, the IP network 174 includes SIP signaling and Wi-Fi or other wireless IP network to the mobile phone. The mobile data network 172 is communicatively coupled to the IP network 174 and the switch 130 is communicatively coupled to the IP network 174. In one embodiment, the communicative couplings to and from the network 174 can be wire line or wireless (i.e., terrestrial- or satellite-based transceivers).

In one embodiment, there is no IP network 174 and the mobile data network 172 is communicatively coupled to the network 190 (either directly or indirectly). For example, the network 190 is a WAN or LAN and the mobile data network 172 is communicatively coupled to the network 190. In another example, the site 100A is a business site and the mobile phone 108 is physically present at the site 100A. The business site has a Wi-Fi network and the mobile phone connects to the network 190 using the Wi-Fi network.

A person having ordinary skill in the art will recognize that there are many ways for the mobile phone 108 to connect to the network 190, and that the examples described above are illustrative, but not limiting, of the scope of the present invention.

Although only a single switch 130A is shown in FIG. 1, those skilled in the art will recognize that a particular site such as the first site 100A may include a plurality of switches 130. The switches 130A, 130B will be described in more detail below with reference to FIG. 2. In one embodiment, the switch 130A includes a Call Application Server 142 ("CAS 142"). The CAS 142 is depicted with a dotted line to depict that it is an optional feature of the switch 130A. The CAS 142 is described in U.S. patent application Ser. No. 12/985,326, the entirety of which is hereby incorporated by reference and referred to herein as "the Unified Communication application." A person having ordinary skill in the art will recognize that the CAS 142 is distinct from the CAS protocol described above.

Site 100A

The first site 100A includes a server 110, a switch 130A, a storage device 140 and eight endpoints (analog phone 121, IP phone 122A and software phone 123, a conference bridge 124, an email client 125, a web client 136, a Mobile Call Manager 138 ("MCM 138") and a Personal Call Manager 141 ("PCM 141").

In the depicted embodiment, the server 110 comprises a Telephony Application Programming Interface 118 ("server-side TAPI 118"), a Telephony Management System 119 ("TMS 119") and an Enterprise Contact Center module 139 ("ECC 139").

In one embodiment, the server 110 comprises the CAS 142. The CAS 142 is depicted with a dashed line in FIG. 1 to indicate that it is an optional feature of the server 110. In one embodiment, the CAS 142 is comprised in the switch 130A. In another embodiment, the CAS 142 is comprised within the switch 130A of the first site 100A and/or the switch 130B of the second site 100B. In yet another embodiment, the system 196 does not include the CAS 142.

The CAS 142, the TAPI 118, the TMS 119, the web client 136, the MCM 138 and the endpoints 122A, 123 are described in the Unified Communication application. These descriptions are incorporated by reference in this application and will not be repeated here. In one embodiment, the first site 100A includes and/or is communicatively coupled to features not depicted in FIG. 1. In one embodiment, the first site 100A includes one or more of a collaboration services device, a voicemail server, a Client Server Internet Service server ("CSIS server") and one or more of the elements depicted in FIGS. 1-3 of the Unified Communication application. The collaboration service device, voicemail server, CSIS server and the elements depicted in FIGS. 1-3 of the Unified Communication application are described in the Unified Communication application. These descriptions are incorporated by reference in this application and will not be repeated here. In one embodiment, the system 196 includes a conventional email server (not depicted in FIG. 1).

The analog phone 121 is a device known to those having skill in the art. The conference bridge 124 is telephony device that connects conference calls. In one embodiment, the conference bridge 124 stores a reservation module 144 and connects conference calls and provides other features as described below with reference to FIGS. 9A, 9B, 9C, 18A and 18B. In one embodiment, the conference bridge 124 connects conference calls without communicating with the ECC 139. In another embodiment, the PCM 141 and the reservation module 144 are stored on the server 110. In yet another embodiment, the PCM 141 and the reservation module 144 are stored in the agent device.

The PCM 141 is described in the Unified Communication application which is incorporated by reference, so that description will not be repeated here. The difference between the PCM 141 depicted in FIG. 1 and the PCM described in the Unified Communication application is that the PCM 141 depicted in FIG. 1 includes a reservation module 144 that communicates with the ECC 139 and different endpoints 121, 122, 123, 124, 125, 136, 138 to provide the functionality described below. Specifically, the reservation module 144 is described below with reference to FIG. 3.

In one embodiment, the web client 136, the PCM 141, the reservation module 144 and/or the MCM 138 is stored on a non-transitory memory (not pictured) of a processor-based device such as a personal computer, a smartphone, etc and executed by the processor (not pictured) of that device. Accordingly, in one embodiment one or more of the web client 136, MCM 138 and the PCM 141 (and the reservation module 144 included in the PCM 141) are comprised within an endpoint such as a personal computer, smartphone, mobile phone, server etc.

The switch 130A represents a Voice over Internet Protocol (VoIP) device to which a number of endpoints can be coupled, such as one or more of endpoints 121, 122A, 123, 124. In one embodiment, the switch 130A is comprised within the server 110 so that the server 110 can provide the functionality of the switch 130A. For example, in one embodiment the sever 110 stores computer code and routines on a memory (not pictured) that is executable by a processor (not pictured) to provide the functionality of the switch 130A (i.e., the sever 110 stores and is configured to execute a softswitch and/or a virtual switch). In another embodiment, electronic circuits are comprised within the server 110 and configured to provide the functionality of the switch 130A. A person having ordinary skill in the art will recognize that there are other ways for configuring the server 110 so that the server 110 provides the functionality of the switch 130A.

In one embodiment, the CAS 142 is comprised within the switch 130A and a protocol adapter 195 is communicatively coupled to the switch 130 via signal line 197. Signal line 197 is depicted with a dashed line to indicate that it is an optional feature of the system 196. The protocol adapter 195 is described in the Unified Communication application which is incorporated by reference, so that description will not be repeated here.

An endpoint enables a user to carry on a communication. A communication includes any communication possible using the endpoints 121, 122, 123, 124, 125, 136, 138, 141 of FIG. 1. For example, a communication includes a telephone call, an email, a chat, a video conference, etc. Although in the illustrated embodiment the first site 100A has eight endpoints 121, 122A, 123, 124, 125, 136, 138, 141, in other embodiments the first site 100A has different numbers and types of endpoints. Examples of endpoints not depicted in FIG. 1 that can be comprised within the first site 100A include a video conferencing device, a Multipoint Control Unit ("MCU"), an Analog Terminal Adapter ("ATA") and any other device that originates and/or terminates a media stream. An endpoint is coupled to the switch 130A, the server 110A or both. Each of the endpoints can also include a display device (not shown) that is used in conjunction with the phone of the endpoint.

Figure 2:
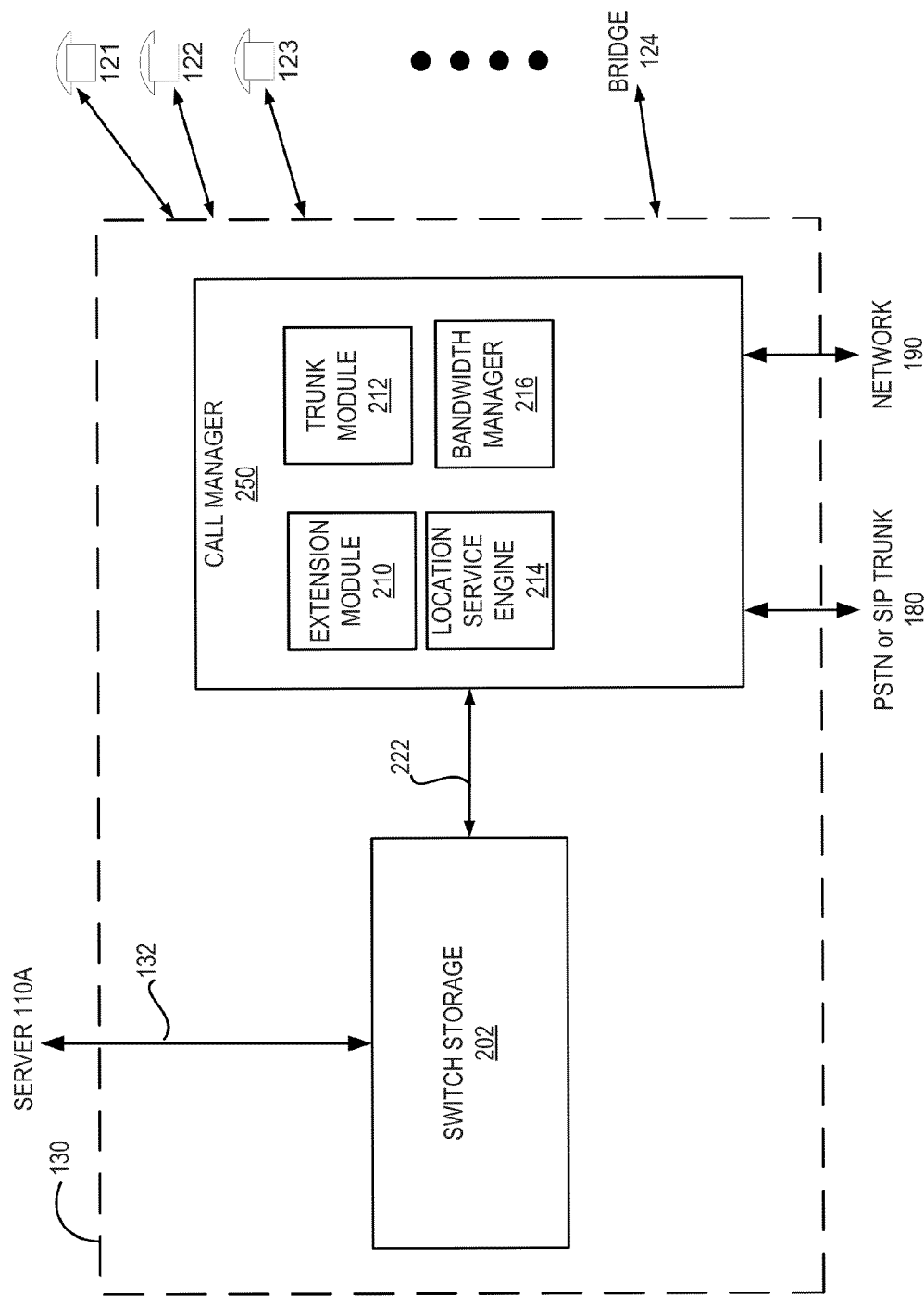
FIG. 2 is a high-level block diagram illustrating a switch according to one embodiment of the present invention.

In one embodiment, the conference bridge 124 is adapted to have the functionality of a switch 130A. For example, the conference bridge 124 includes hardware that provides the conference bridge 124 with the functionality of a switch 130A. Such hardware includes, for example, one or more electronic circuit boards, one or more processors and/or a non-transitory storage device (e.g., flash memory, hard drive, etc.) storing data and/or software (e.g., a call manager as depicted in FIG. 2, element 250), and these components are configured to work together with the other components of the conference bridge so that the conference bridge 124 has the functionality of a switch 130A. In another embodiment, the conference bridge 124 has, among other things, a processor and a non-transitory storage memory that stores a call manager 250 that, when executed by the processor, causes the conference bridge 124 to have the functionality of a switch 130A.

In one embodiment, an endpoint 121, 122, 123, 124 has a user interface to send data to and receive data from a user. The analog phone 121 has, for example, a Telephone User Interface ("TUI") that sends data through a speaker and receives data through a microphone and a keypad. The IP phone 122 has, for example, both a TUI and a Graphical User Interface ("GUI") that sends data through a display device associated with the IP phone 122. In one embodiment, the IP phone's graphical user interface also receives data from a touch screen display device associated with the IP phone 122. The software phone 123 has, for example, a software application that runs on a computer and sends data through a display device and a speaker and receives data through a microphone, a keyboard and a pointing device. A person having ordinary skill in the art will recognize that other user interfaces are possible for the endpoints 121, 122, 123, 124, 125, 136, 138, 141. In one embodiment, for example, one or more endpoints are communicatively coupled to a computer monitor that acts as the display for the endpoint (e.g., a softphone 123, email client 125, web client 136 and/or PCM 141 is stored and executed by a personal computer communicatively coupled to a computer monitor to display GUIs for the endpoint).

The server 110 is configured to implement features or functions of the telephony system in accordance with the present invention. The server 110 is communicatively coupled to the network 190, the first switch 130A, the email client 125, the storage device 140, the web client 136, the MCM 138 and the PCM 141. In one embodiment, the server 110 is communicatively coupled to the PSTN 180 via signal line 198. In another embodiment, the server 110 includes the CAS 142 and is communicatively coupled to the protocol adapter 195 via signal line 199. In yet another embodiment, the server 110 is communicatively coupled to the second switch 130B.

As described above, the server 110 includes the TAPI 118, the TMS 119 and the ECC 139. The server 110 optionally includes the CAS 142. The TAPI 118, TMS 119, ECC 139 (and optionally the CAS 142) are communicatively coupled to one another.

The server 110 implements a server architecture according to one embodiment of the present invention. The server 110 includes a processor (not pictured). The processor is a conventional processing device, such as a general-purpose microprocessor. The server 110 also includes a non-transitory computer-readable memory ("the memory" or "a memory"). The memory includes program instructions or functional units that in one embodiment implement features of the present invention. Specifically, in one embodiment the TAPI 118 and a TMS 119 are stored in a memory of the server 110 along with a directory unit (not pictured). In one embodiment, the memory also includes one or more application units that interact with the TAPI 118 and the TMS 119 to enable a specific computer-integrated function. An application unit uses the TAPI 118 to exchange data with the TMS 119. The TMS 119 communicates with and manages one or more switches 130. For example, with reference to FIG. 1, the TMS 119 included in the server 110A manages the switches 130A, 130B. Through the TAPI 118, the TMS 119 presents an application with Computer-Telephony Integration ("CTI") view of these switches 130A, 130B. The application manages the switches 130A, 130B. Switches 130A, 130B operate without an associated TMS 119 if CTI features are not being used.

In one embodiment, the server 110 has a user interface to send data to and receive data from a user. The user interface interacts with the TMS 119 in order to allow a user with administrative rights to manage the switches 130A, 130B, change the configuration settings of the switches 130A, 130B, queue criteria described below with reference to FIG. 3, the configuration data described below with reference to FIG. 3 and/or the login data described below with reference to FIG. 3. The user can access the user interface at the server 110. For example, the server 110 stores and executes a conventional web browser application. The server serves a web page including the user interface. The user accesses the user interface via the web browser. The user changes the configuration settings, queue criteria, configuration data and/or the login data using the user interface.

In one embodiment the server 110 includes an application unit and/or a directory unit. The application unit assists the switch 130A in providing one or more phones (e.g., phones 121, 122A, 122B 123) communicatively coupled to the switch 130A (directly or indirectly) with access to PBX applications (e.g., among others, instant messaging, collaboration tools, sidebar conversations between two or more users during ongoing PBX calls, chat sessions between two or more users and/or APIs for integrating third party applications with the standard PBX functions provided by the switch 130A). For example, the application unit is data and routines stored on a non-transitory computer-readable medium comprised within the server 110. In one embodiment, one or more of the application unit and directory unit is comprised within the CAS 142.

In general, the directory unit enables a phone to access a directory and use the directory in conjunction with other phone functions. In one embodiment, the directory unit is implemented as a service that interacts with TMS 119. In another embodiment, the directory unit is comprised within the CAS 142. Communication or data exchange is between the TMS 119 and the directory unit. The directory unit can be distributed among computing devices as is known to one of skill in the art. For example, the functionality enabled by directory unit can be implemented in a client-server fashion by having the client (user's local system, such as a general-purpose computer or endpoint) perform some functions and having the server 110 (directory unit) perform others. As another example, some or all of the functionality enabled by the directory unit can be implemented by having a switch 130A perform some or all functions. In one embodiment, the communication or data exchange is between a client and CAS 142.

The ECC 139 is computer code and routines stored on a non-transitory computer-readable medium (not pictured) comprised within the server 110 and executable by a processor (not pictured) of the server 110 provide third party users with: (1) an automated and/or interactive communication experience based on a script executed by an automated attendant or an Interactive Voice Response module ("IVR") stored on the server 110 or the switch 130A; (2) a communication experience with a live human user of an endpoint 121, 122, 123, 124, 125, 136, 138, 141; or (3) a combination of an automated and/or interactive communication experience and a communication experience with a live human user of an endpoint 121, 122, 123, 124, 125, 136, 138, 141. Embodiments of other endpoints with a live human user, the automated attendant, IVR and script are described in the application having U.S. patent application Ser. No. 12/895,729 and entitled "CALL RECOVERY," the entirety of which is hereby incorporated by reference in the present application. In one embodiment, the ECC 139 is the ShoreTel Enterprise Contact Center application offered by ShoreTel™ of Sunnyvale, Calif.

In one embodiment, the ECC 139 is configured to make outbound calls. For example, the ECC 139 makes outbound calls that are connected to reserved agents of the endpoints 121, 122, 123, 124, 125, 136, 138, 141. This embodiment is described in more detail with reference to FIG. 6.

In one embodiment, communications with the ECC 139 include one or more of the third party user, an IVR, an automated attendant and an agent. A third party user is any human user that communicates with the ECC 139 and is not an agent. The third party user communicates with the ECC 139 using a communication device such as a mobile phone, POTS phone, IP phone, chat application, email client, etc. In one embodiment, the third party user initiated communication with the ECC 139. For example, the third party user is a customer calling a customer service call center. In another embodiment the ECC 139 initiates the communication with the third party user. For example, the ECC 139 calls the third party user to collect political polling data from the third party user (i.e., the ECC 139 plays a script that is configured to collect political polling data). An agent is a human user associated with an endpoint 121, 122, 123, 124, 125, 136, 138, 141 at the first site 100A or the second site 100B. For example, the first site 100A is a customer support call center and the third party user is a customer that initiates communication with the call center by calling the ECC 139. The ECC 139 plays an IVR script for the third party user to determine, among other things, how the communication should be routed, i.e., which agent at the first site 100A should handle the communication with the third party user.

In one embodiment, the ECC 139 gathers and stores data about the third party user. This data is referred to herein as "communication data." In one embodiment, the communication data includes one or more of: (1) a communication identifier; (2) the topic of the communication; (3) a time at which communication was received by the ECC 139; (4) the progress of the call in an automated attendant or IVR script; (5) the form of the communication (e.g., any combination of an audio call, a video call, an email or a chat); (6) a time at which the communication ended; (7) an indication that the communication is important (e.g., the communication involves an important client, the communication is an important sales call, etc.); and (8) the name of a user or customer the call is for. If the communication is a telephone call, then the communication identifier is a call identifier including information for calling the customer back (e.g., a telephone number, SIP address, etc). If the communication is an email, then the communication identifier is an email address. If the communication is a chat, then the communication identifier is a chat address. In one embodiment, the ECC 139 initiates communication with the third party user using the communication identifier. For example, if a telephone call between the third party user and the ECC 139 is terminated, the ECC 139 uses the communication identifier to call the third party user back for a contact back event. A contact back event is described with reference to FIG. 3. The ECC 139 then automatically connects the call with a reserved agent. This embodiment is described in further detail with reference to FIG. 6. In another embodiment, the communication identifier is provided to an agent that then uses the communication identifier to call the third party user back (e.g., a contact back event). Persons having ordinary skill in the art will recognize that other communication identifiers not listed above are possible for telephone calls, emails and chats. Such a person will also recognize that other forms of communication are possible, such as video calls, web and/or audio conferences, etc, and these communication forms have other communication identifiers not listed above.

In one embodiment, the ECC 139 gathers the communication data based on the third party user's answers to the script executed by the automated attendant and/or the IVR. The third party user and the ECC 139 communicate via one or more of a telephone call, chat, email, video conference, etc. In one embodiment, the ECC 139 includes different scripts for these different forms of communication. Thus, the communication experience provided by the ECC 139 includes one or more of a telephone call, a chat, an email, a video conference, etc. The ECC 139 executes the script and collects the communication data. In one embodiment, the ECC 139 is communicatively coupled to the storage device 140 and stores the communication data in a communication data unit described with reference to FIG. 3 (i.e., communication data unit 301). The ECC 139 determines how to route the communication based on the communication data, e.g., which agent the call should be routed to. In one embodiment, the agents are geographically present at a call center. In another embodiment, one or more of the agents are remotely located and not physically present at the call center. In one embodiment, a simulation module 311 comprised within the reservation module 144 simulates call strings using the communication data and/or other data.

A call center is a grouping of resources that respond to inbound communications and place outbound communications. In one embodiment, the first site 100A is a call center. For example, the first site 100A is a customer service call center. A human user of the POTS phone 107 calls the customer service call center. The ECC 139 receives the call via the switch 130A and does one of the following: (1) connects the call to an automated attendant or IVR; (2) connects the call to a human user of an endpoint at the first site 100A or an associated site (e.g., second site 100B); or (3) connects the call to automated attendant or IVR for a period of time and then transfers the call to a agent device associated with an endpoint at the first site 100A or an associated site. Thus, the ECC 139 determines how incoming communications are handled by the call center. In one embodiment, for step (2) described above, the ECC 139 determines a human user having an appropriate skill set to handle the call and connects the call to that human user. For example, the ECC 139 determines what the subject matter of the call is, accesses a stored database having a record of the skill sets for the different human users, determines a user having an appropriate skill set that matches the subject matter of the call and connects the call to that determined human user. Persons having ordinary skill in the art will recognize other features of the call center 139.

In one embodiment, the ECC 139 is stored on the switch 130A and executed by a processor of the switch 130A.

The storage device 140 is a non-transitory computer readable medium that stores, for example, directory information (not pictured) and/or other information described with reference to FIG. 3. The directory information includes directory entries and associations between directories and phones. In one embodiment, the storage device 140 also includes information regarding which users have administrative rights to access the server's user interface and make changes to data stored in the storage device 140 or other memories comprised within the server 110 and/or the switches 130A, 130B. The storage device 140 is described in more detail with reference to FIG. 3.

Site 100B

The second site 100B includes an IP phone 122B and a switch 130B. The IP phone 122B is an endpoint. The switch 130B is communicatively coupled to the network 190 and the IP phone 122B. In one embodiment, the CAS 142 is comprised in the switch 130B. In another embodiment, the second site 100B includes different and/or additional endpoints. For example, the second site 100B includes one or more of the endpoints 121, 123, 124, 125, 136, 138, 141. The elements of the second site 100B work similar to the elements of the first site 100A described above, and so, that description will not be repeated here. Similar elements have similar reference numerals.

A person having ordinary skill in the art will recognize that in one embodiment, the system 196 includes one or more third party servers (not shown) similar to server 110 that provide, among other things, third-party applications to the endpoints 121, 122, 123, 124, 125, 136, 138, 141 via the network 190. For example, in one embodiment the third party server includes a CAS plug-in as described in the Unified Communication application.

Reference is made below to an agent device. An agent device is a hardware device including any of the endpoints described endpoints described above for FIG. 1. For example, an agent device is an analog phone 121, an IP phone 122, a POT phone 107, a mobile phone 108, a bridge 124 (for instances where the bridge is a hardware bridge 124) or a processor-based hardware device that stores and executes a software phone 123, a bridge 124 (for instances where the bridge 124 is a virtual bridge), an email client 125, a web client 136, an MCM 138 and a PCM 141. In one embodiment, the agent device includes an extension for the agent device.

Switch 130

Referring now to FIG. 2, an embodiment of the switch 130 according to one embodiment of the present invention is shown. In one embodiment, the switch 130A includes one or more processors (not shown). The processor can be a conventional processing device, such as a general-purpose microprocessor. In a different embodiment, the switch 130 does not include a processor but is instead controlled by a processor comprised within a server 110 at the same site 100A and/or a server 110 at a different site 100 (e.g., site 100B).

The switch 130 also includes a non-transitory computer readable memory (e.g., flash memory). The memory stores, among other things, software and routines (not shown) conventionally used to operate a switch 130 in a VoIP telephony system 196. For example, the switch 130 includes software routines for performing call monitoring, transferring calls, placing calls on hold, establishing hunt groups, automated attendant functions, call setup, call teardown, etc. The memory also stores program instructions or functional units that implement the features of the present invention. The switch 130 also includes a switch storage module 202 and a call manager 250.

The switch storage module 202 is a memory for storing data and information. For example, the switch storage module 202 stores data and information utilized by the call manager 250 to perform its functions. In one embodiment, the switch storage module 202 is a tangible, non-transitory computer readable memory (e.g., flash memory). The switch storage module 202 is communicatively coupled to the call manager 250 via signal line 222. In one embodiment, the switch storage module 202 is a portion of the memory of the switch 130.

A device, such as the processor of the switch 130, runs the call manager 250 software application and is coupled to and controls one or more endpoints (e.g., 121, 122A, 122B, 123, 124, 125) with which it is associated. While shown as operational and as part of the switch 130 in FIG. 2, in other embodiments the call manager 250 is operational as a separate module in a site 100A or as part of a server 110 or conference bridge 124.

Although in the illustrated embodiment site 100A has only one call manager 250 comprised within the switch 130, in other embodiments the site 100A has a different number of call managers 250. In one embodiment, more than one call manager 250 can control the same endpoint 121, 123, 122A, 122B, 124. The association between a call manager 250 and an endpoint 121, 123, 122A, 122B, 124 that it controls is accessed through the server 110. In one embodiment, the second switch 130B includes its own call manager 250 and switch storage 202 similar to the first switch 130.

In one embodiment, the trunk 180 is a SIP trunk and provides connectivity to SIP-compatible devices. One having ordinary skill in the art will recognize that network 190 also provides connectivity for SIP-compatible devices.

As shown in FIG. 2, the call manager 250 is coupled to the PSTN or SIP trunk 180 and the network 190. The call manager 250 comprises: an extension module 210; a trunk module 212; a location service engine 214; and a bandwidth manager 216. In one embodiment, the manager module 208 described above is a module comprised within the call manager 250.

The extension module 210 communicates with endpoints coupled to the call manager 250 in order to allow a user to perform call-related functions on an endpoint. In addition, the extension module 210 is used to communicate with other call managers 250 in the telephony system 196.

The trunk module 212 is coupled to and controls the interaction between the endpoints 121, 122 and 123 and the PSTN or SIP trunk 180. In particular, the call manager 250/switch 130 is often coupled to a trunk line. The trunk module 212 of the call manager 250 manages the usage of the trunk line by multiple endpoints 121, 122 and 123 and optimizes the usage of the trunk line. The trunk module 212 also manages trunk services such as caller identification, direct inward dial, etc.

The location service engine 214 resolves the dialed numbers (converts raw dialed digits into routable contacts) and routes the call to the destination endpoint such a phone, trunk, hunt group, auto attendant, pickup group etc.

The bandwidth manager 216 is coupled to the network 190 and allocates bandwidth necessary to support calls handled by the call manager 250.

In one embodiment, one or more of the above described components of the call manager (i.e., the extension module 210, trunk module 212, location service engine 214, bandwidth manager 216) are codes and routines stored on a memory comprised within the switch 130 and executable by the switch's processor to provide the functionality described above.

In another embodiment, one or more of the above described components of the call manager 250 are a specialized hardware devices configured to perform the function of the particular components. For example, one or more of the manager module 208, schedule module 230, extension module 210, trunk module 212, location service engine 214 and bandwidth manager 216 is a combination of one or more electronic circuit boards configured to provide the above-described functionality for that component. In one embodiment, the one or more electronic circuit boards that comprises the component includes one or more of: (1) a processor; (2) a non-transitory computer-readable memory (e.g., flash memory, a hard-drive, a buffer, a circular buffer, etc.) communicatively coupled to the processor; and (3) processor-executable firmware stored on the non-transitory memory.

Reservation Module 144 and Storage Device 140

Figure 3:
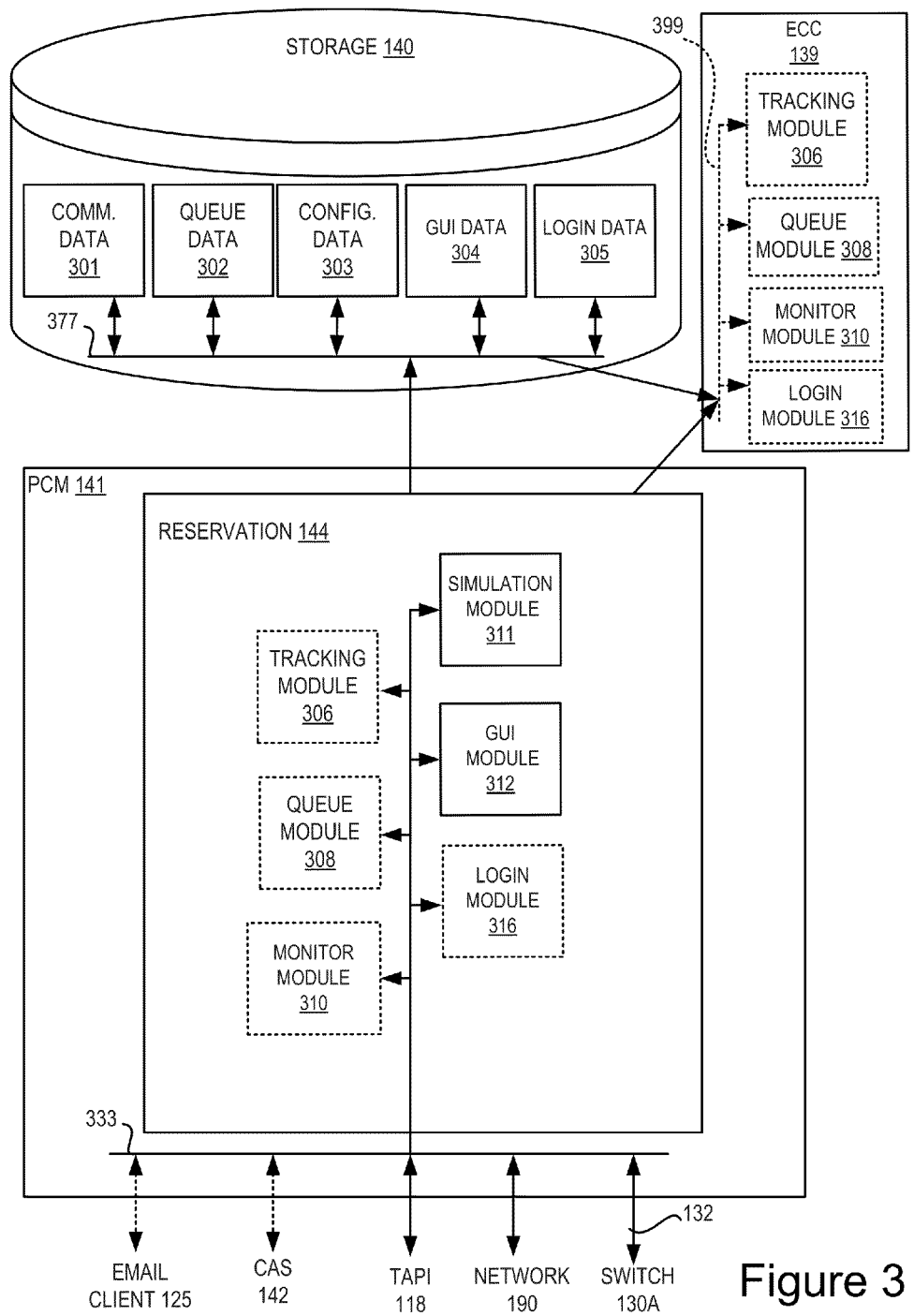
FIG. 3 is a block diagram illustrating a reservation module according to one embodiment of the present invention.

FIG. 3 depicts the reservation module 144 and the storage device 140. In the depicted embodiment, the reservation module 144 is comprised within the PCM 141 and communicatively coupled to the email client 125, the CAS 142, the TAPI 118, the network 190 and the switch 130A via a first bus 333. In one embodiment, the reservation module 144 is communicatively coupled to the endpoints 121, 122, 123, 124, 125, 136, 138 via the switch 130A. The modules 306, 308, 310, 311, 312, 316 of the reservation module 144 are communicatively coupled to one another as well as the email client 125, the CAS 142, the TAPI 118, the network 190 and the switch 130A via the first bus 333. The reservation module 144 is also communicatively coupled to the ECC 139 and the data storage device 140. The modules 306, 308, 310, 311, 312, 316 of the reservation module 144 are also communicatively coupled to the different units 301, 302, 303, 304, 305 of the data storage unit 140. The modules 306, 308, 310, 316 in the reservation module 144 are depicted with a dashed line to indicate that they are optional features of the reservation module; in one embodiment, one or more of the modules 306, 308, 310, 316 are comprised within the ECC 139. In embodiments where the modules 306, 308, 310, 316 are included in the ECC 139, they are communicatively coupled to one another, the different storage units 301, 302, 303, 304, 305 and the other modules 311, 312 included in the reservation module 144 via a bus 399. The bus 399 is depicted using a dash line to indicate that it is an optional feature of the ECC 139. In one embodiment, one or more of the modules 311, 312, 316 are stored in the CAS 142 (not pictured).

The storage device 140 is communicatively coupled to the ECC 139 and the reservation module 144 (as well as the modules 306, 308, 310, 311, 312, 316 of the reservation module 144). The storage device 140 is a non-transitory memory that stores data and/or information used by the PCM 141, the reservation module 144 and/or the ECC 139 to perform their functions. The storage device 140 comprises: a communication data unit 301; a queue data unit 302; a configuration data unit 303; a GUI data unit 304; and a login data unit 305. The storage device 140 is communicatively coupled to the PCM 141, the reservation module 144 and the ECC 139. The storage units 301, 302, 303, 304, 305 are non-transitory memories that store data and/or information. In one embodiment, the storage units 301, 302, 303, 304, 305 are communicatively coupled to one another, the ECC 139 and the reservation module 144 via a second bus 377. The communication data unit 301 stores communication data. The communication data is described above with reference to the ECC 139. The queue data unit 302 stores queue data. The queue data is described below with reference to the queue module 308. The configuration data unit 303 stores configuration data used by the GUI module 312 to generate GUIs. The configuration data includes, for example, user preference for which data (e.g., call strings, icons, buttons, etc.) should be displayed in GUIs generated by the GUI module 312. The configuration data is described below with reference to the GUI module 312. The GUI data unit 304 stores various data described below with reference to FIG. 4. In one embodiment, the GUI data includes graphics data necessary to generate the GUIs depicted, for example, in FIGS. 13A-18. The login data 305 stores login data used by the login module 316 to authenticate an agent device to the reservation module 144. The login data is described below with reference to the login module 316. In one embodiment, the login data 305 authenticates a participant device to the reservation module 144 using methods similar to authenticating an agent device. As described below, a participant device is any hardware device capable of connecting to a conference call as described herein.

The reservation module 144 comprises: a tracking module 306; a queue module 308; a monitor module 310; a simulation module 311; a GUI module 312; and a login module 316. In the depicted embodiment the reservation modules 306, 308, 310, 311, 312, 316 are communicatively coupled to one another. The reservation modules 306, 308, 310, 311, 312, 316 are coupled differently in other embodiments. In one embodiment, the reservation module 144 is comprised in the PCM 141 and the PCM 141 is stored in a memory of a processor-based computing device (e.g., a processor-based client device). The processor of the computing device executes the reservation module 144 and the sub-modules of the reservation module 144.

The tracking module 306 is code and routines stored on a non-transitory memory (not pictured) and executed by a processor (not pictured) for identifying communications, detecting queue events and transmitting an indication of the queue events to the queue module 308. In one embodiment, the tracking module 306 is comprised in the reservation module 144. In another embodiment, the tracking module 306 is comprised in the ECC 139. As described above, the tracking module 306 detects queue events. A queue event is an indication that a third party should be contacted by an agent. The tracking module 306 communicates with the ECC 139 and/or the TMS 119 through the TAPI 118 to determine queue events. In one embodiment, the ECC 139 determines that a communication is terminated by a third party user and the tracking module 306 determines a queue event responsive to the termination. For example, a third party user communicates with the ECC 139 via a telephone call. The tracking module 306 communicates with the ECC 139 and/or the TAPI 118 to track this call. The ECC 139 determines that the third party user terminated the call. The ECC 139 and/or TAPI 118 communicates this termination event to the tracking module 306. The tracking module 306 generates a queue event responsive to the termination event. The tracking module 306 communicates with the queue module 308 to send the queue event to the queue module 308. As described below, this queue event triggers a contact back event (described below, for example, with reference to the simulation module 311 and the GUI module 312). A person having ordinary skill in the art will recognize how this same example is applicable to video conference calls and calls received from a user of a mobile phone 108. In one embodiment, the tracking module 306 determines queue events for chat communications. For example, a third party user communications with the ECC 139 (and/or an agent) via a chat session. The tracking module 306 communicates with the ECC 139 to track this call. The ECC 139 determines that chat session is terminated. The ECC 139 communicates this termination event to the tracking module 306. The tracking module 306 determines a queue event responsive to the termination event. The tracking module 306 communicates with the queue module 308 to send the queue event to the queue module 308. The queue event triggers a contact back event.

The queue module 308 is code and routines stored on a non-transitory memory (not pictured) and executed by a processor (not pictured) for generating and maintaining queue data that is stored in the queue data unit 302. In one embodiment, the queue module 308 is comprised in the reservation module 144. In another embodiment, the queue module 308 is comprised in the ECC 139. The queue module 308 receives a communication from the tracking module 306 reporting a queue event. The queue module 308 is communicatively coupled to the communication data unit 301. The queue module 308 retrieves the communication data from the communication data unit 301. The queue module 308 uses the communication data to generate the queue data. The queue data includes an ordered list of communication identifiers ("a contact back list"). The contact back list is ordered based on one or more predetermined criteria that are stored in the configuration data unit 303. In one embodiment, the predetermined criteria are provided by an administrator or any human user having sufficient access rights to provide the access criteria. For example, an administrator having certain access rights accesses the interface of the server 110 (described above) and provides one or more criteria for ranking the communication identifiers in the queue data. The criteria can include receipt order (the time at which a communication was received at the ECC 139, with communications received earliest being ranked higher or lower based on this criteria), termination order (the time at which a communication was terminated at the ECC 139, with communications terminated earliest being ranked higher or lower based on this criteria), importance order (how important the other party in the communication is), or any combination of the above (e.g., communications received earliest in time by the ECC 139 are ranked higher, but communications identifiers for important parties are ranked in a higher order than other communications identifiers that are not indicated as important in the tracking data).

In one embodiment, the contact back list includes any combination of the communication data described above with reference to the ECC 139. For example, the contact back list includes the communication identifier, an indication of the topic of the initial communication between the ECC 139 and the third party user and an indication that the third party user is important.

In one embodiment, the ECC 139 attempts to communicate with a third party user based on the ordering of the contact back list (referred to herein as "a contact back event"). For example, the contact back list includes a telephone number for a third party user and an indication of the topic of the initial call between the ECC 139 and the third party user. The ECC 139 attempts to communicate with a third party user with the highest ranked communication identifier in the contact back list and connect a reserved agent on the call with the third party user, for example, using a GUI and a simulated TAPI call string described below with reference to the simulation module 311 and the GUI module 312. The reservation module 144 presents a reserved agent with a GUI having depicting a simulated communication between the agent and the third party user. The agent attempts to communicate with the third party user. In one embodiment, the agent has the option to decline to attempt communication with the third party user. In another embodiment, the agent does not have this option. The simulated communication is described in more detail below with reference to FIG. 6.

The monitor module 310 is code and routines stored on a non-transitory memory (not pictured) and executed by a processor (not pictured) for (1) accessing the contact back list stored in the queue data unit 302 to determine whether to initiate a contact back event and (2) communicating with the switch 130A, ECC 139 and/or the TAPI 118 to reserve an agent for the contact back event. In one embodiment, the monitor module 310 is comprised in the reservation module 144. In another embodiment, the monitor module 310 is comprised in the ECC 139. In one embodiment, the monitor module 310 initiates a contact back event for a first highest ranked communication identifier in the contact back list.

In one embodiment, the monitor module 310 deletes the first highest ranked communication identifier after a predetermined number of attempts to communicate with the first highest ranked identifier. The predetermined number of attempts is based on the configuration data described with reference to FIG. 3 below. For example, the configuration data includes data defining the number of predetermined attempts. In one embodiment, different attempts to communication with the first highest ranked communication identifier can be of a different form of communication (e.g., a first attempt is via telephone call, a second attempt is via email, a third attempt is via chat, and so on). The monitor module 310 deletes the first highest ranked communication identifier from the contact back list. The contact back list is refreshed so that a second highest ranked communication identifier is present in the contact back list. In one embodiment, the contact back list is refreshed after the first highest ranked communication identifier is deleted. The second highest ranked communication identifier is the highest ranked communication identifier in the contact back list after (1) deleting the first highest ranked communication identifier from the contact back list and, optionally, (2) the tracking module 306 adding new communication identifiers to the contact back list. This process is repeated so long as communication identifiers are present in the contact back list.

As described above, the monitor module 310 also reserves an agent for the contact back event. The agent is a human user of any endpoint communicatively coupled to the reservation module 144. For example, the agent is a human user of any endpoint at the first site 100A, the second site 100B, the POTS phone 107, the mobile phone 108 and/or a personal computer (not pictured) that stores and executes a endpoint similar to the web client 136, PCM 141, software phone 123, email client 125 and/or any other endpoint capable of communication with the reservation module 144. In one embodiment, the monitor module 310 monitors endpoints to determine agents that are available to participate in a contact back event. For example, the switch 130A stores information (e.g., on switch storage 202) about which devices are currently being used and the monitor module 306 communicates with the switch 130A to determine which agents are available to participate in a contact back event. In another embodiment, the monitor module 310 monitors agents by communicating with the TAPI 118 to determine which agents are available. An available agent is any agent that is not currently engaged in communication and is present at an endpoint. In one embodiment, an agent is "not currently engaged in communication" if no calls are currently forwarded to the agent by the ECC 139. In another embodiment, an agent is present at an endpoint if the agent is logged into the endpoint. In yet another embodiment, the agent is present at an endpoint if the agent is one or more of (1) logged in to an endpoint and (2) the ECC 139 has forwarded one or more calls to the agent. In one embodiment, an agent can enter a released state that prevents the ECC 139 from forwarded calls to the agent (e.g., if the agent needs to take a break from work, the agent provides an input indicating to the ECC 139 and/or reservation module 144 to place the agent in the released state). A released state is a "between calls" state an agent enters when doing something not related to servicing the workgroup. The monitor module 310 places an available agent in a reserved state (also referred to herein as "a reserved agent," and/or "an agent reserved for callback state"). A reserved agent is an agent that is identified by the monitor module 310 as available and is placed in a reserved state by the monitor module 310. In one embodiment, the ECC 139 attempts to communicate with the third party user associated with the highest ranked communication identifier after the reserved agent accepts an invitation to participate in the contact back event. In another embodiment, ECC 139 attempts to communicate with the third party user associated with the highest ranked communication identifier automatically after the reserved agent is in a reserved state for a predetermined period of time.

In one embodiment, the monitor module 310 communicates with the simulation module 311 and/or the GUI module 312. For example, the monitor module 310 sends an indication of the call back event to simulation module 311 so that the simulation module 311 knows to begin simulating call strings for the contact event. Similarly, the monitor module 310 sends an indication of the contact back event to the GUI module 312 so that the GUI module 312 is triggered to generate and send events describing a desired GUI state to a display-enabled endpoint associated with the reserved agent. In another embodiment, the monitor module 310 communicates with the ECC 139 to indicate that the agent is in a reserved state, and the ECC 139 communicates with the simulation module 311 and/or the GUI module 312 to trigger the actions described above for the simulation module 311 and the GUI module 312.

In one embodiment, the monitor module 310 places the agent in the reserved state without having received a notification from the TAPI 118 ("a TAPI notification") that the third party user is calling the reserved agent. This embodiment is described in greater detail in the description of the GUI module 312. In one embodiment, the third party user does not call the reserved agent directly. In this embodiment the third party user calls the ECC 139 and the ECC 139 connects the third party user to the reserved agent.

The simulation module 311 is code and routines stored on a non-transitory memory (not pictured) and executed by a processor (not pictured) for generating simulated communication information (i.e., simulated TAPI information, simulated email information, simulated chat information, etc). In one embodiment, the simulated call information is simulated TAPI information (e.g., "a simulated TAPI caller identification string" or "a simulated TAPI call string"). A simulated TAPI call string is a string of data that is configured to look like an actual TAPI call string when in fact no TAPI call is actually ongoing for the simulated TAPI call string. The simulation module 311 is communicatively coupled to one or more of the ECC 139, the monitor module 310, the GUI module 312 and the storage 140. The simulation module 311 receives an ECC call string ("ECC call string") from the ECC 139. In one embodiment, the ECC call string indicates to simulation module 311 that a contact back event is occurring. The simulation module 311 generates the simulated TAPI information using the ECC call string received from the ECC 139.

In one embodiment, the simulated TAPI information is a group of one or more objects. When a call is simulated the one or more objects are initialized and filled with values from the ECC call string and/or call information such as "which customer are we being reserved for", etc. Later, when the call is actually made, the one or more objects are refreshed with the non-simulated TAPI data for the actual call. For example, the TAPI 118 provides the following TAPI information that is used to refresh the objects: (1) a caller ID and routing information or (2) a routing slip (e.g. "third party user A called ECC 139, ECC 139 transferred the call to agent B, agent B put the call on hold, agent B retrieved the call after a period of time on hold"). In one embodiment, there is no TAPI call when the agent is in the reserved state and the system 196 uses the ECC identifier to generate the ECC call string instead of using the TAPI identifier. The ECC identifier is generated by the ECC 139 when the agent is reserved. In this embodiment, the system 196 also does not have a caller ID, so, the system 196 uses the ECC routing number along with the ECC identifier to generate the ECC call string.

In one embodiment, the simulated TAPI information includes a simulated TAPI call string for a "simulated call" (or a "virtualized call"). A simulated call (i.e., "a virtualized call") is a call appearance generated using the simulated TAPI call string.

In one embodiment, the simulation module 311 is communicatively coupled to the TAPI 118. The simulation module 311 places the simulated TAPI call string in a call tracker array of the TAPI 118. A person having ordinary skill in the art will recognize that the call tracker array is a component of the TAPI 118. The simulated TAPI call string is picked up by the other components of the PCM 141 without the other components of the system 196 knowing that the TAPI call string is for a virtualized call. For example, the GUI module 312 (described below) then picks up the simulated TAPI call string so that it is displayed in a GUI generated by the GUI module 312. In one embodiment, the simulated TAPI call string is stored in one or more of the GUI data unit and the call tracker array.

In one embodiment, the simulation module 311 generates simulated email information based off an email address received from the ECC 139. The simulated email information is a call string that includes information describing a simulated email communication between the reserved agent and the third party user. For example, the simulated email information is the call string 1508 depicted in FIG. 15.

In one embodiment, the simulation module 311 generates simulated chat information based off a chat address received from the ECC 139. The simulated chat information is a call string that includes information describing a virtualized chat communication between the reserved agent and a third party user. For example, the simulated chat information is the call string 1416 depicted in FIG. 14A.

The GUI module 312 is code and routines stored on a non-transitory memory (not pictured) and executed by a processor (not pictured) for generating a GUI. In one embodiment, the GUI module 312 is communicatively coupled to the storage device 140, the TAPI 118 and a display device of an endpoint associated with the reserved agent. In one embodiment, the GUI module 312 generates a GUI based on one or more GUI inputs. The GUI inputs include one or more of: (1) the GUI data stored in the GUI data unit 304, (2) the simulated communication information; (3) the queue data stored in the queue data unit 302; (4) the configuration data stored in the configuration data unit 303; (5) data received in a communication with the ECC 139 indicating that an agent is in a reserved state; (6) data received from the monitor module 310 indicating that the agent is in a reserved state; and (7) a TAPI notification received from the TAPI 118. For example, the GUI module 312 generates a GUI such as those depicted in FIGS. 13A-15 and 18B based on data, information and/or TAPI notification described above.

In one embodiment, the GUIs generated by the GUI module 312 are displayed on a display device of one or more of the endpoints 122, 123, 124, 125, 136, 138, 141. In one embodiment, the GUI module 312 is communicatively coupled to the endpoints 122, 123, 124, 125, 136, 138, 141 to provide the GUI data necessary to generate these GUIs.

In one embodiment, the GUI generated by the GUI module 312 includes one or more of the following features: (1) a reserved communicator call cell; (2) an icon in the reserved communicator call cell to indicate the agent is in a reserved state; (3) an icon in the reserved communicator call cell to indicate the form of the connection; (4) a communicator call string in the reserved communicator call cell including data specified by the configuration data (described below); (5) an icon in the reserved communicator call cell to indicate that the reserved agent has an option to participate in the contact back event; (6) an icon in the reserved communicator call cell to indicate that the reserved agent does not have an option to decline to participate in the contact back event; (7) a window including a button that is clickable by the reserved agent to participate in the contact back event; (8) a window including a button that is clickable by the reserved agent to decline to participate in the contact back event; (9) a key to help the agent to understand the call string; (10) a notification bubble reminding the reserved agent to use an email client stored on and executed by an personal computer of the reserved agent to retrieve email messages from the email server (not pictured); and (11) an interface to change the configuration data stored in the configuration storage unit.

The GUI data stored in the GUI data unit 304 includes graphics data necessary to generate a GUI including one or more of the above described features, as well as all of the features depicted in FIGS. 13A-18B. The GUI module 312 accesses the configuration data stored in the configuration data unit 303 to determine which features to include in different GUIs generated by the GUI module 312. In one embodiment, the GUI module 312 generates a GUI used by a human user to input the configuration data stored in the configuration data unit 303 (see, for example, FIG. 16, element 1610).

A reserved communicator call cell is a call cell generated by GUI module 312 and displayed on the display device of an endpoint used by the reserved agent. The reserved communicator call cell indicates that an agent is in a reserved state. The reserved communicator call cell is displayed on the display device of the endpoint during the delay period (the delay period is described below). If the reserved agent clicks the accept button the reserved agent is connected on a call with the ECC 139. In one embodiment, the connected call with the ECC 139 also includes a third party user associated with the highest ranked communication identifier. The GUI module 312 generates a connected communicator call cell. In one embodiment, the connected communicator call cell includes, among other things, an icon to indicate that the reserved agent is connected on the call with the ECC 139.

In one embodiment, the reserved communicator call cell is a GUI item that the reserved agent uses to interact with the contact back event. The reserved communicator call cell includes all the graphical buttons necessary to interact with the contact back event. For example, reserved communicator call cell includes one or more of (1) a button the agent can click (e.g., with a mouse) to participate in the contact back event ("an accept button" or "an answer button") and/or (2) a button the agent can click to decline to participate in the contact back event ("a decline button"). In another embodiment, the reserved communicator call cell integrates data received from the ECC along with data received from the PCM 141 and/or the TAPI 118. For example, the reserved communicator call string included in the reserved communicator call cell includes (1) both TAPI information (e.g., the simulated TAPI call string) and ECC information (e.g., an ECC call string) or (2) a portion of the TAPI information and a portion of the ECC information (this is referred to herein as "a combination call string"). In one embodiment, the simulation module 311 generates the combination call string. One skilled in the art will recognize that other GUI features may be used as alternatives to clickable buttons (e.g., icons, links, tabs, text-fillable fields, drop down boxes, etc.).

As described above, in one embodiment the monitor module 310 places the agent in the reserved state without having received a notification from the TAPI 118 ("a TAPI notification"). This portion of the application continues with the description of this embodiment. The monitor module 310 places the agent in a reserved state and for a period of time the reserved agent is not connected on the call with the ECC 139. This period of time is referred to herein as "a delay period." During the delay period the reserved communicator call cell includes both simulated TAPI information (e.g., such as described with reference to the simulation module 311) and ECC information (e.g., the ECC call string). Because the simulated TAPI information looks like a TAPI string for a currently connected call with the ECC 139, the GUI presented to the reserved agent has an appearance that makes it look as though the reserved agent is currently connected on a call with the ECC 139 when in fact the reserved agent is not connected on a call with the ECC 139. This feature beneficially provides the reserved agent with a familiar graphic that communicates the appearance of an imminent call to the reserved agent.

In one embodiment, the GUI module 312 retrieves configuration data indicating the reserved agent does not have the option to decline the call and the GUI module 312 configures the GUI accordingly. For example, the GUI module 312 generates a GUI without a decline button. In one embodiment, in addition to indicating that the reserved agent does not have the option to decline the call, the configuration data also includes data that causes the reservation module 144 to automatically connect the reserved agent on the call with the ECC 139 after a period of time indicated by the configuration data. For example, after a period of time reserved agent is connected on the call with the ECC 139 and the GUI module 312 causes a GUI to be displayed that includes an icon in the reserved communicator call cell that indicates that the reserved agent is connected on the call with the ECC 139. In another embodiment, GUI module 312 retrieves configuration data indicating that the reserved agent has the option to decline the call and the GUI module 312 configures the GUI accordingly. For example, the GUI module 312 generates a GUI having a reserved communicator call cell with a decline button. The decline button is in the reserved communicator call cell or a window that is separate from the reserved communicator call cell.

In one embodiment, the GUI module 312 generates a connected communicator call cell when the reserved agent is connected on the call with the ECC 139. Since the reserved agent is connected on the call with the ECC 139, the simulated call represented by the simulated TAPI information is ended. However, the TAPI 118 does not send a termination notification responsive to the simulated call ending. Instead, the ECC 139 detects that it is connected on the call with the reserved agent. The ECC 139 sends an "OnReleased" notification to the reservation module 144 to indicate that the reserved agent is now connected on the call with the ECC 139. The "OnReleased" notification indicates to the reservation module 144 that the agent is no longer in the reserved state and the delay period is ended. The simulated TAPI call string is removed from the TAPI call tracker array and GUI module 312 removes the reserved communicator call cell from the display of the endpoint associated with the agent that is now connected on the call with the ECC 139 (the "agent" described here was previously described as the "reserved agent"). In one embodiment, the GUI module 312 instead modifies the reserved communicator call cell so that it reflects the connected state of the call and includes data similar to a connected communicator call cell. The GUI module 312 communicates with the GUI data unit 304 to retrieve data for generating a connected communicator call cell that includes an indication (e.g., an icon) that the agent is now connected to the ECC 139. The GUI module 312 sends the GUI data (which includes data for displaying the connected communicator call cell) to the display of the endpoint associated with the agent. In one embodiment, the GUI module 312 receives additional information from the ECC 139 that is used to generate the GUI including the connected communicator call cell. This additional information is included in the displayed connected communicator call cell in addition to the information included in normal TAPI call cells. For example, element 1316 is additional information included in the displayed connected communicator call cell.

In one embodiment, the ECC call string comprises one or more of the following ECC properties: a TAPI call identifier (e.g., a TAPI call ID); a ECC call identifier that is generated by the ECC 139 and/or the reservation module 144 when an agent device and/or an extension are placed in a reserved state; a call start time indicating the time when the incoming call began (e.g., when the call from the third party was received or began); a first extension number for an agent device being communicated with; and a second extension number for the ECC 139. The ECC 139 communicates with the reservation module 144 to signal to the reservation module 144 to add one or more of the ECC properties to the call (e.g., the GUI module 312 includes graphical representations of this data in the GUIs generated by the GUI module 312).

The login module 316 is code and routines stored on a non-transitory memory (not pictured) and executed by a processor (not pictured) for authenticating a user to the reservation module 144. The login module 316 is communicatively coupled to the login data unit 305. The login module 316 requests a user to provide login input. The login input is any data used to authenticate the user. For example, a user ID and a password. The login module 316 receives a login input. The login module 316 communicates with the login data unit 305 to authenticate the login input. For example, the login data unit 305 stores a list of known valid login inputs and the login module 316 checks compares the received login input against the known valid inputs in order to authenticate the user of an agent device. In one embodiment, the login module 316 then reads the configuration data 303 to identify the agent device the user is assigned to. In one embodiment, the User ID is an extension number for an agent device and the lookup is not required. In yet another embodiment, the User ID is the user name. In one embodiment, the user is authorized to use the system based upon other means such being authenticated to a Lightweight Directory Access Protocol ("LDAP") directory.
GUI Data 304

Figure 4:
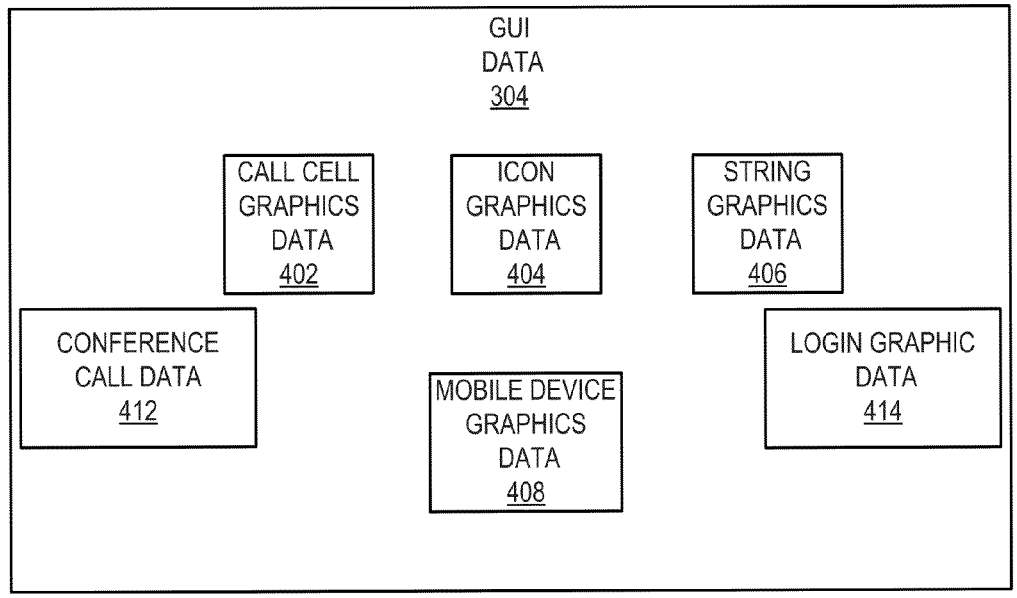
FIG. 4 is a block diagram illustrating a graphical user interface data according to one embodiment of the present invention.

FIG. 4 is a block diagram illustrating GUI data stored in the GUI data unit 304 according to one embodiment of the present invention. The GUI data unit 304 comprises: call cell graphics data 402; icon graphic data 404; string graphics data 406; mobile device graphics data 408; conference call data 412; and login graphic data 414. The GUI data unit 304 is communicatively coupled to the GUI module 312. The GUI data unit 304 communicates with the GUI module 312 so that the GUI module 312 can perform the functionality described above for the GUI module 312.

The call cell graphics data 402 includes graphics data used by the GUI module 312 to generate GUIs that include call cells. In one embodiment, the call cell graphics data 402 is used by the GUI module 312 to generate GUIs that include one or more of a reserved communicator call cell, a connected communicator call cell, etc. For example, the call cell graphics data is used to generate GUIs including call cells such as those depicted in 13A, 13B, 13C, 14A, 14B, 15 and 18B.

The icon graphics data 404 includes graphics data used by the GUI module 312 to generate GUIs that include icons. In one embodiment, the icon graphics data 404 is used by the GUI module 312 to generate GUIs that include one or more of: (1) an icon in the reserved communicator call cell to indicate the agent is in a reserved state; (2) an icon in the reserved communicator call cell to indicate the form of the connection (telephone call, email, chat, etc); (3) an icon in the reserved communicator call cell to indicate that the reserved agent has an option to participate in the contact back event; and (4) an icon in the reserved communicator call cell to indicate that the reserved agent does not have an option to participate in the contact back event. For example, the call cell graphics data is used to generate GUIs including icons such as those depicted in 13A, 13B, 13C, 14A, 14B, 15 and 18B.

The string data 406 includes graphics data used by the GUI module 312 to generate GUIs that include call strings. In one embodiment, the string data 406 is used by the GUI module 312 to generate GUIs that include one or more of: (1) an ECC call string; (2) a simulated TAPI call string; (3) a combination of a ECC call string and simulated TAPI call string; (4) a TAPI call string for an actual ongoing TAPI call; (5) a combination of a ECC call string and a TAPI call string for an actual ongoing TAPI call; (6) a combination of a portion of a ECC call string and a portion of a TAPI call string. For example, the call cell graphics data is used to generate GUIs including call strings such as those depicted in FIGS. 13A, 13B, 14 and 15.

The mobile device graphics data 408 includes graphics data used by the GUI module 312 to provide the functionality of the reservation module 144 to a mobile phone device 108.

The conference call data 412 includes graphics data used by the GUI module 312 to generate GUIs for setting up conference calls as described below for FIGS. 9A, 9B and 9C. The conference call data 412 includes graphical data used by the GUI module 312 to generate a GUI for an administrator to set up a conference call, a GUI to remind a member of a conference call about the time for the conference call, a GUI to reserve the member for the conference call and other GUIs described below for FIGS. 9A, 9B and 9C. For example, the call cell graphics data is used to generate GUIs such as the one depicted in FIG. 18B.

The login graphic data 414 includes graphics data used by the GUI module 312 to generate GUIs for authenticating an agent device to the reservation module 144. The login graphic data 414 includes graphical data used by the GUI module 312 to generate a GUI for the login module to request and receive login information from an agent device. For example, the login graphics data is used to generate GUIs such as the one depicted in FIG. 17.
Mobile Phone 108

Figure 5:
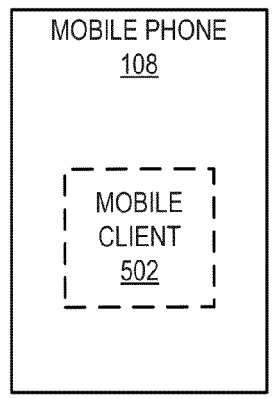
FIG. 5 is a block diagram illustrating a mobile phone according to one embodiment of the present invention.

FIG. 5 is a block diagram illustrating a mobile phone 108 according to one embodiment of the present invention. In one embodiment, the mobile phone 108 includes a mobile client 502. The mobile client 502 is code and routines stored on a non-transitory memory (not pictured) of the mobile phone 108 and executed by a processor (not pictured) of the mobile phone 108 for communicating with the reservation module 144 so that the mobile phone can function as an endpoint of a reserved agent. For example, the mobile phone 108 uses the mobile client 502 to communicate with the GUI module 312. In one embodiment, the mobile client 502 communicates with the reservation module 144 via the CAS 142. In another embodiment, the mobile client 502 is an MCM similar to MCM 138.

Methods

Figure 6:
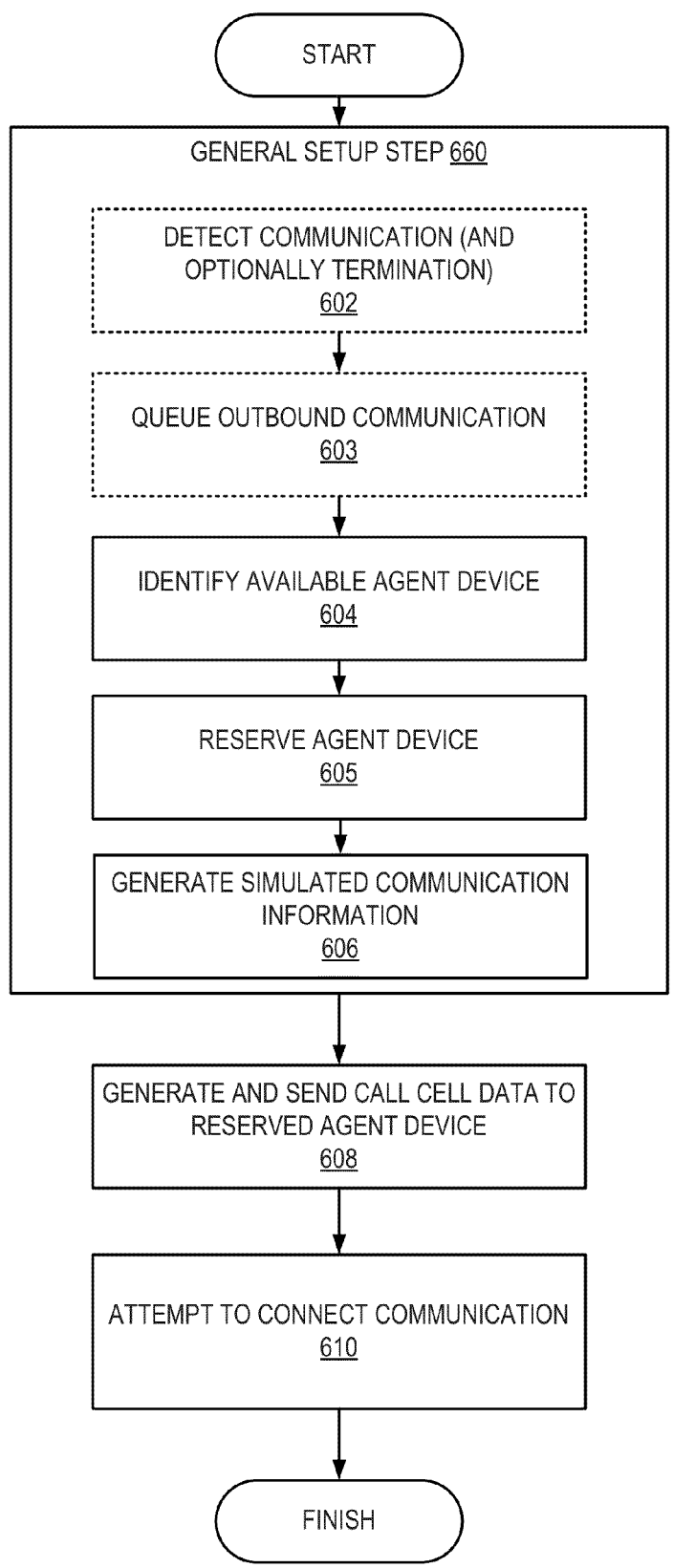
FIG. 6 is a flowchart illustrating a method performed by the reservation module to simulate a communication according to one embodiment of the present invention.

FIG. 6 is a flowchart illustrating a method 600 performed by the reservation module 144 to simulate a communication according to one embodiment of the present invention. A general setup step 660 is repeated in the methods 700, 800, 900, 1000 described below with reference to FIGS. 7A-10. The tracking module 306 detects 602 a communication (and optionally a termination). The queue module 308 queues 603 the outbound communication. For example, the queue module 308 queues 603 a communication identifier responsive to a call termination event. The monitor module 310 identifies 604 an available agent device. For example, the monitor module 310 identifies an agent available to participate in a contact back event. The monitor module 310 reserves 605 the identified agent device. The delay period begins. The simulation module 311 works with the ECC 139 to generate 606 the simulated communication information for a virtualized communication (e.g., a virtualized call, a virtualized chat, etc.) In one embodiment, the simulated communication information is simulated TAPI information. For example, the simulated TAPI information is a simulated TAPI call string generated based on an ECC call string received from the ECC 139. The simulator module 311 stores the simulated TAPI information and/or the ECC call string in one or more of the GUI data unit 304 or a TAPI call tracker array. The general setup step 660 ends.

In one embodiment, the general setup step 660 does not include steps 602 and 603. Steps 602 and 603 are depicted in FIG. 6 with a dashed line to indicate that they are optional features of the general setup step 660. For example, the monitor module 310 moves the agent device for an agent into a reserved state 605 to alert the agent that it will soon be handling an incoming customer call. The call cell is modified as the actual incoming call is connected to transition from the reserved state to the actual call. In one embodiment, during the reserve state the call cell includes data identifying the general subject matter the agent should expect the call to be about.

In one embodiment, the general setup step 660 reserves a pool of reserved agents. A pool of reserved agents is more than one reserved agent. For example, at step 604 the monitor module 310 identifies more than one agent and at step 605 the monitor module reserves 605 more than one of the agents identified at step 604. The agents reserved at step 605 form the pool of reserved agents. In one embodiment, the pool of reserved agents comprises tens or even hundreds of reserved agents. In one embodiment, a reserved agent is unavailable for other incoming calls, chats, emails, etc. In yet another embodiment, the reserved agent can initiate outgoing calls, chats, emails, etc.

At step 608 the GUI module 312 generates a GUI based on one or more of the GUI inputs (e.g., a GUI input provided by an administrator using a GUI exposed to the administrator and/or a GUI input provided by a third party user). In one embodiment, the GUI module 312 generates a GUI based on one or more of: (1) a system configuration; (2) the content of the simulated communication relevant to the third party user (e.g., based on inputs provided by the third party user); (3) the mode of contact used by the third party user (e.g. calls, chat, email, etc); and (4) the GUI data 304 described with reference to FIG. 4. The GUI module 312 sends the GUI to a display of an endpoint associated with the reserved agent. For example, the GUI module 312 sends a GUI to the reserved agent similar to the one depicted in FIG. 13A. The reservation module 144 and the ECC 139 communicate with the endpoint to attempt 610 to connect the endpoint on a call with a third party user. For example, the GUI module 312 sends a GUI to the reserved agent similar to the one depicted in FIG. 13B in which the reserved agent has the option to click the answer button and participate in the contact back event. In one embodiment, reserving an agent device 605 includes a toast between the reservation module 144 (and/or the PCM 141) and the reserved agent device.

Figure 7A:
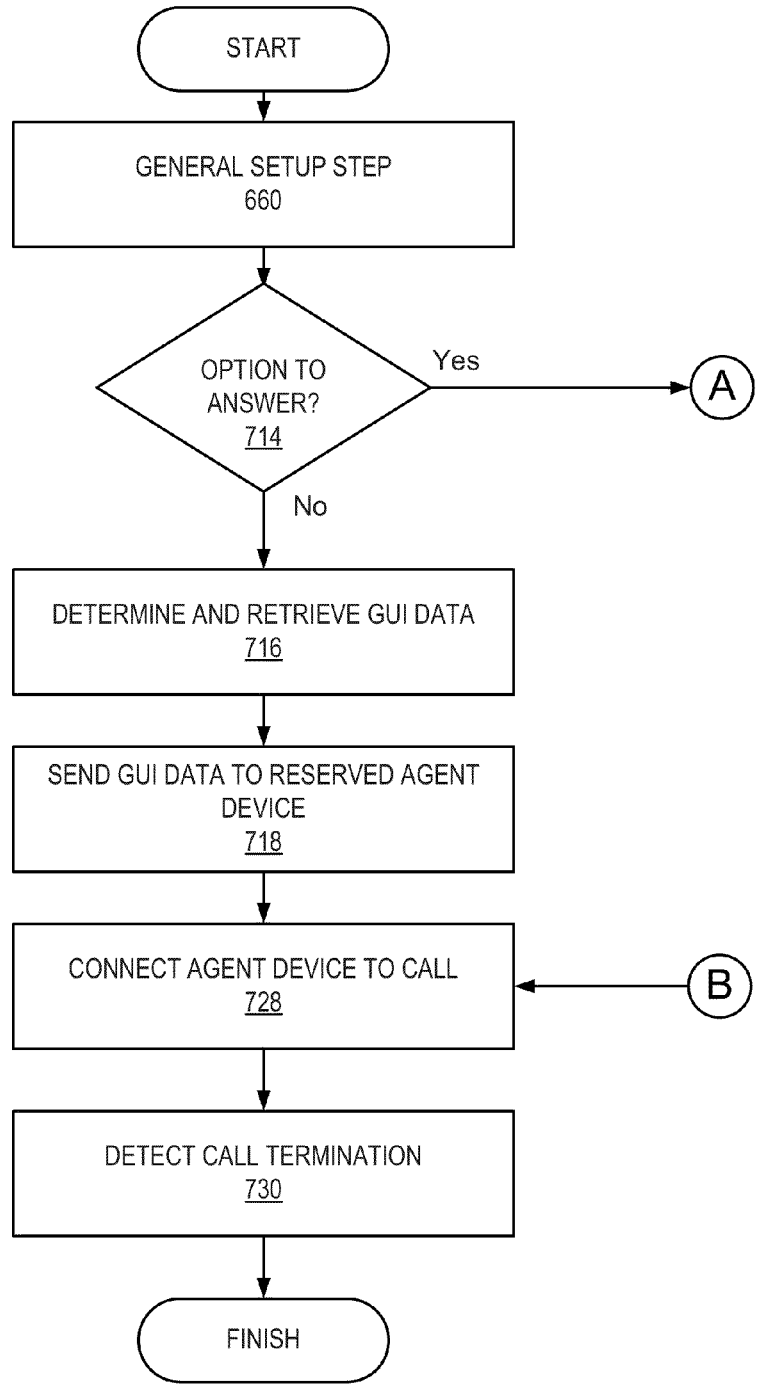
FIGS. 7A and 7B is a flowchart illustrating a method performed by the reservation module to simulate a telephone call according to one embodiment of the present invention.
Figure 7B:
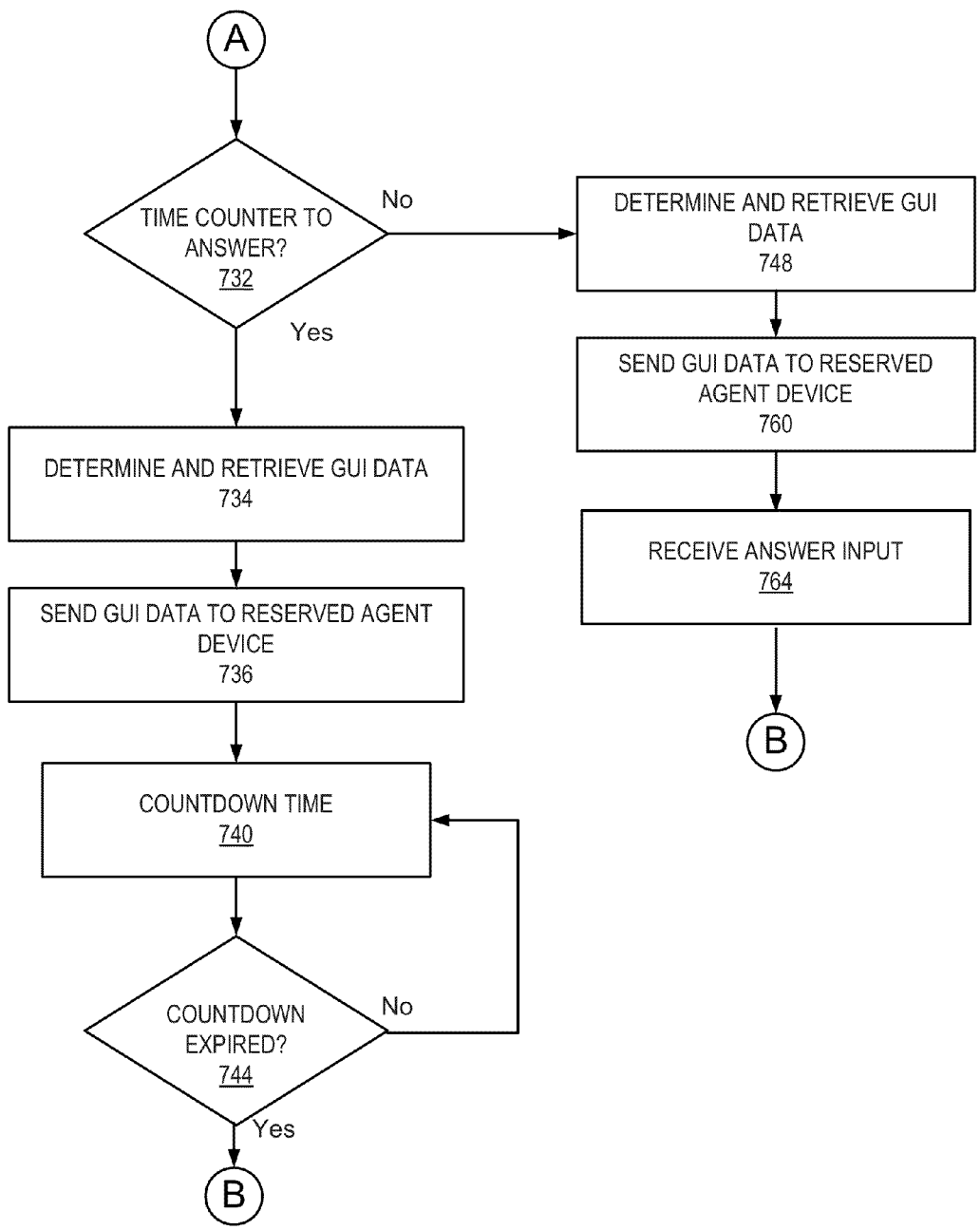

FIGS. 7A and 7B is a flowchart illustrating a method 700 performed by the reservation module 144 to simulate a telephone call according to one embodiment of the present invention. The reservation module 144 performs the general setup step 660 described above with reference to FIG. 6. The GUI module 312 communicates 714 with the GUI data unit 304 to determine if the reserved agent has the option to answer the call. If the reserved agent does not have the option to answer, the method 700 moves to step 716. The GUI module 312 determines and retrieves 716 the GUI data for generating GUIs based on one or more of the GUI inputs. The GUI module 312 sends 718 the GUI data to the reserved agent device. For example, the GUI module 312 sends a GUI to the reserved agent similar to the one depicted in FIG. 13B in which the reserved agent has the option to click the answer button and participate in the contact back event. Since the determination at step 714 was "no," the GUI depicted in FIG. 13B does not include a button that the reserved agent can click to decline to participate in the call. In one embodiment, the reserved agent is automatically connected to the call after a predetermined period of time or a predetermined period of telephone rings. The reservation module 144, the ECC 139 and the TAPI 118 communicate 728 with one another to connect the reserved agent to the call. The reservation module 144 communicates with one or more of the ECC 139 and the TAPI 118 to determine that the call has terminated 730 and the method 700 ends.

At step 714 the GUI module 312 determines whether the configuration data provides the reserved agent with an option to answer the call. If the determination at step 714 is "yes," the method 700 moves to FIG. 7B. Turning now to FIG. 7B, at step 732 a determination is made regarding whether a time counter is used to answer the call. For example, the GUI module 310 communicates with the configuration data 303 to determine whether a time counter is used to connect the call. A time counter is known to those having skill in the art. For example, a time counter includes a register having a predetermined time. At the expiration of the predetermined period of time, an event occurs. For example, the reserved agent is connected on the call and the delay period ends. If the determination at step 732 is "yes," the method 700 moves to step 734. The GUI module 312 determines and retrieves GUI data 734 based on the GUI inputs. The GUI module 312 sends GUI data to the reserved agent device 736. The reservation module 144 begins 740 to countdown a predetermine period of time until the reserved agent is connected on the call. For example, the reservation module 144 deducts a time unit from the counter. For example, the predetermined period of time is 8 seconds and the reservation module 144 deducts one unit of time from the time counter so that 7 seconds remain in the time counter. In one embodiment, the predetermined period of time is based on the configuration data. The reservation module 144 determines whether the countdown has expired (e.g., whether the predetermined period of time has elapsed so that the time reflected in the time counter is 0 seconds). If the determination is "no," the reservation moves to step 740 and the method 700 repeats steps 740 and 744. If the determination at step 744 is "yes," then the method 700 moves to step 728 described above for FIG. 7A.

If the determination at step 732 is "no," then the method moves to step 748. The GUI module 312 determines and retrieves GUI data 748 based on one or more of the GUI inputs. The GUI module 312 sends 760 the GUI data to the reserved agent device. For example, the GUI module 312 sends a GUI to the reserved agent similar to the one depicted in FIG. 13B with the exception that the GUI includes both an "answer button" and a "decline button" since the determination at step 714 was "yes" and so, the reserved agent has the option to decline to answer the call. The reservation module 744 receives 764 an answer input and the method 700 proceeds to step 728 described above for FIG. 7A. In one embodiment, the reservation module 744 receives a decline input. In this embodiment, the reservation module 144 reserves the next available agent (i.e., a second reserved agent) and the method 700 is repeated for the second reserved agent. In one embodiment, the monitor module 310 reserves a pool of reserved agents in the general setup step 660 and, responsive to receiving a decline input, the reservation module 144 selects a reserved agent from the pool and moves to step 714 in the method 700. In one embodiment, the user has the option not to answer the call, and at step 764 the user provides an input to the reservation module 144 that the call is not accepted. The reservation module 144 reroutes the call to a second agent device identified as being available at step 604. The steps of method 700 are then repeated for the second agent device.

Figure 8A:
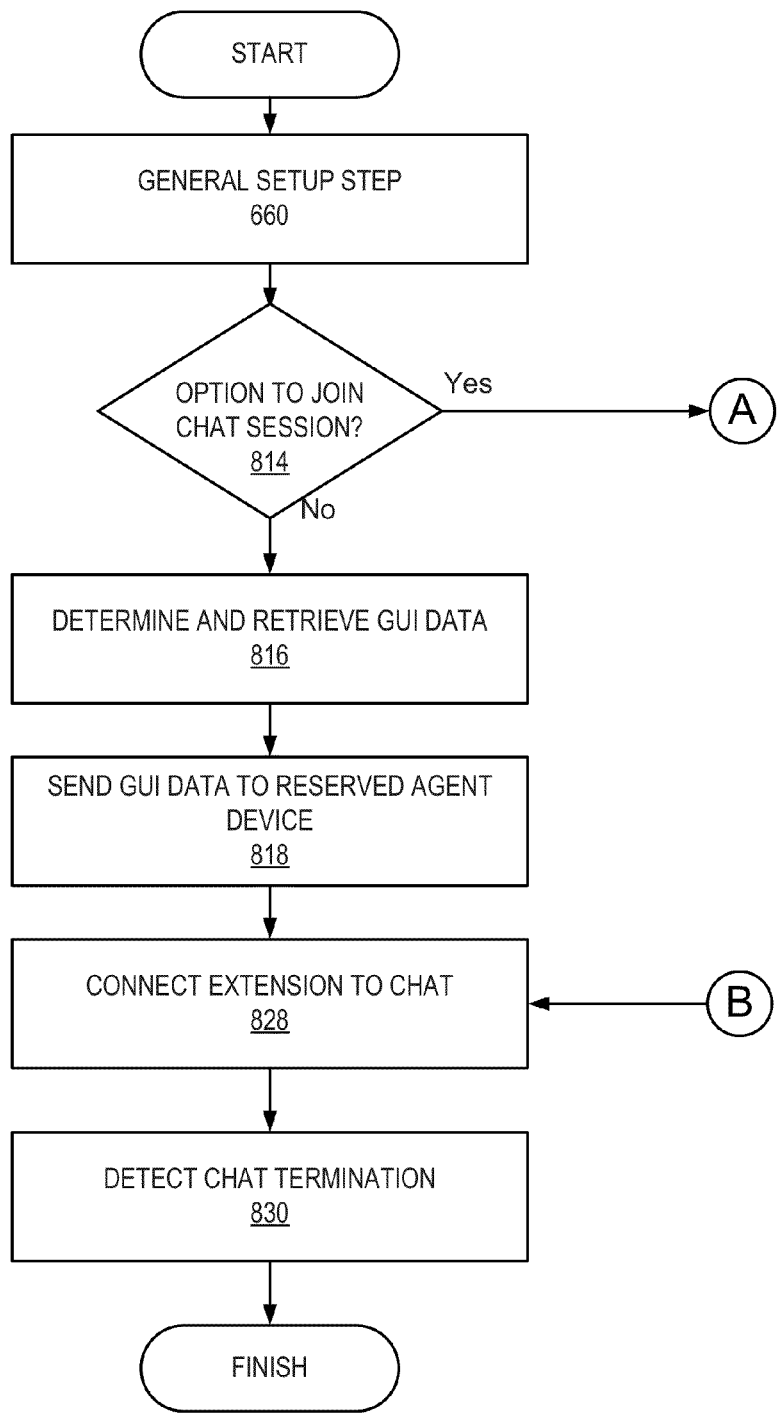
FIGS. 8A and 8B are a flowchart illustrating a method performed by the reservation module to simulate a chat according to one embodiment of the present invention.
Figure 8B:
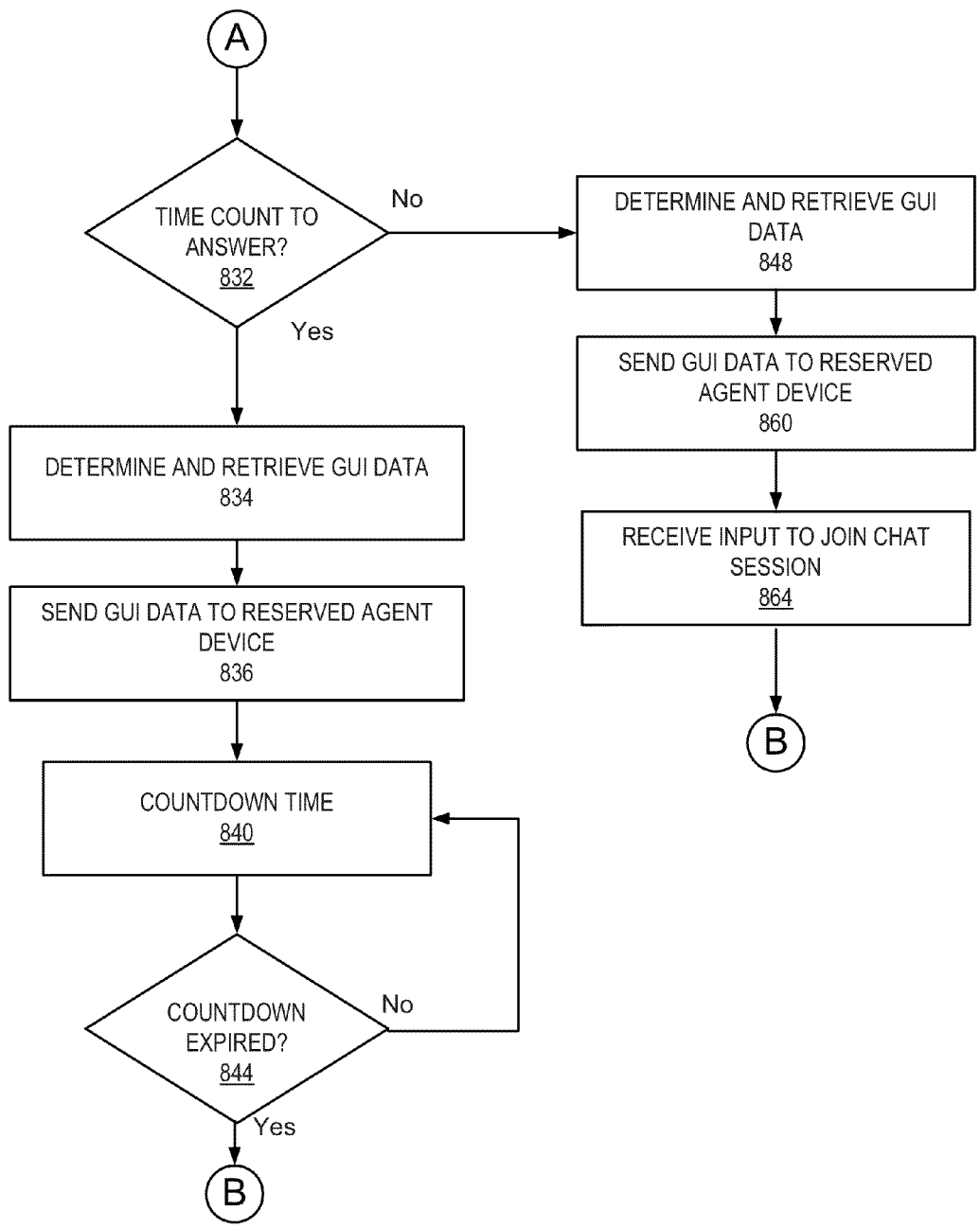

FIGS. 8A and 8B are a flowchart illustrating a method 800 performed by the reservation module 144 to simulate a chat according to one embodiment of the present invention. The reservation module 144 performs the general setup step 660 described above with reference to FIG. 6. The GUI module 312 communicates 814 with the GUI data unit 304 to determine if the reserved agent has the option to join the chat session. If the reserved agent does not have the option to answer, the method 800 moves to step 816. The GUI module 312 determines and retrieves 816 the GUI data for generating GUIs based on one or more of the GUI inputs. The GUI module 312 sends 818 the GUI data to the reserved agent device. For example, the GUI module 312 sends a GUI to the reserved agent similar to the one depicted in FIG. 14A. In one embodiment, the reserved agent is automatically connected to the chat session after a predetermined period of time. The reservation module 144, the ECC 139 and optionally the CAS 142 communicate 828 with one another to connect the reserved agent to the chat session. The reservation module 144 communicates with one or more of the ECC 139 and the CAS 142 to determine that the chat session has terminated 830 and the method 800 ends.

At step 814 the GUI module 312 determines whether the configuration data provides the reserved agent with an option to join the chat session 814. If the determination at step 714 is "yes," the method 800 moves to FIG. 8B. Turning now to FIG. 8B, at step 832 a determination is made regarding whether a time counter is used to determine when the reserved agent will join the chat session. For example, the GUI module 310 communicates with the configuration data 303 to determine whether a time counter is used to determine when the reserved agent will join the chat session. When the time period expires, the reservation module 144 connects the reserved agent so that the reserved agent joins the chat session. If the determination at step 832 is "yes," the method 800 moves to step 834. The GUI module 312 determines and retrieves GUI data 834 based on one or more of the GUI inputs. The GUI module 312 sends 836 the GUI data to the reserved agent device. The reservation module 144 begins 840 to countdown a predetermine period of time until the reserved agent is connected on the call. For example, the reservation module 144 deducts a time unit from the time counter. The reservation module 144 determines whether the time in the time counter has expired (i.e., whether the predetermined period of time has elapsed). If the determination is "no," the reservation moves to step 840 and the method 800 repeats steps 840 and 844. If the determination at step 844 is "yes," then the method 800 moves to step 828 described above for FIG. 8A.

If the determination at step 832 is "no," then the method moves to step 848. The GUI module 812 determines and retrieves GUI data 848 based on one or more of the GUI inputs. The GUI module 812 sends 860 the GUI data to the reserved agent device. The reservation module 344 receives 864 an input from the reserved agent to join the chat session and the method 800 proceeds to step 828 described above for FIG. 8A. In one embodiment, the reservation module 844 receives a decline input indicating that the reserved agent does not want to participate in the contact back event. In this embodiment, the reservation module 144 reserves the next available agent (i.e., a second reserved agent) and the method 800 is repeated for the second reserved agent. In one embodiment, the user has the option not to join the chat session, and at step 864 the user provides an input to the reservation module 144 that the chat is not accepted. The reservation module 144 reroutes the chat to a second agent device identified as being available at step 604. The steps of method 800 are then repeated for the second agent device.

In one embodiment, the monitor module 310 reserves a pool of reserved agents in the general setup step 660 and, responsive to receiving a decline input, the reservation module 144 selects a reserved agent from the pool and moves to step 814 in the method 800.

Figure 9A:
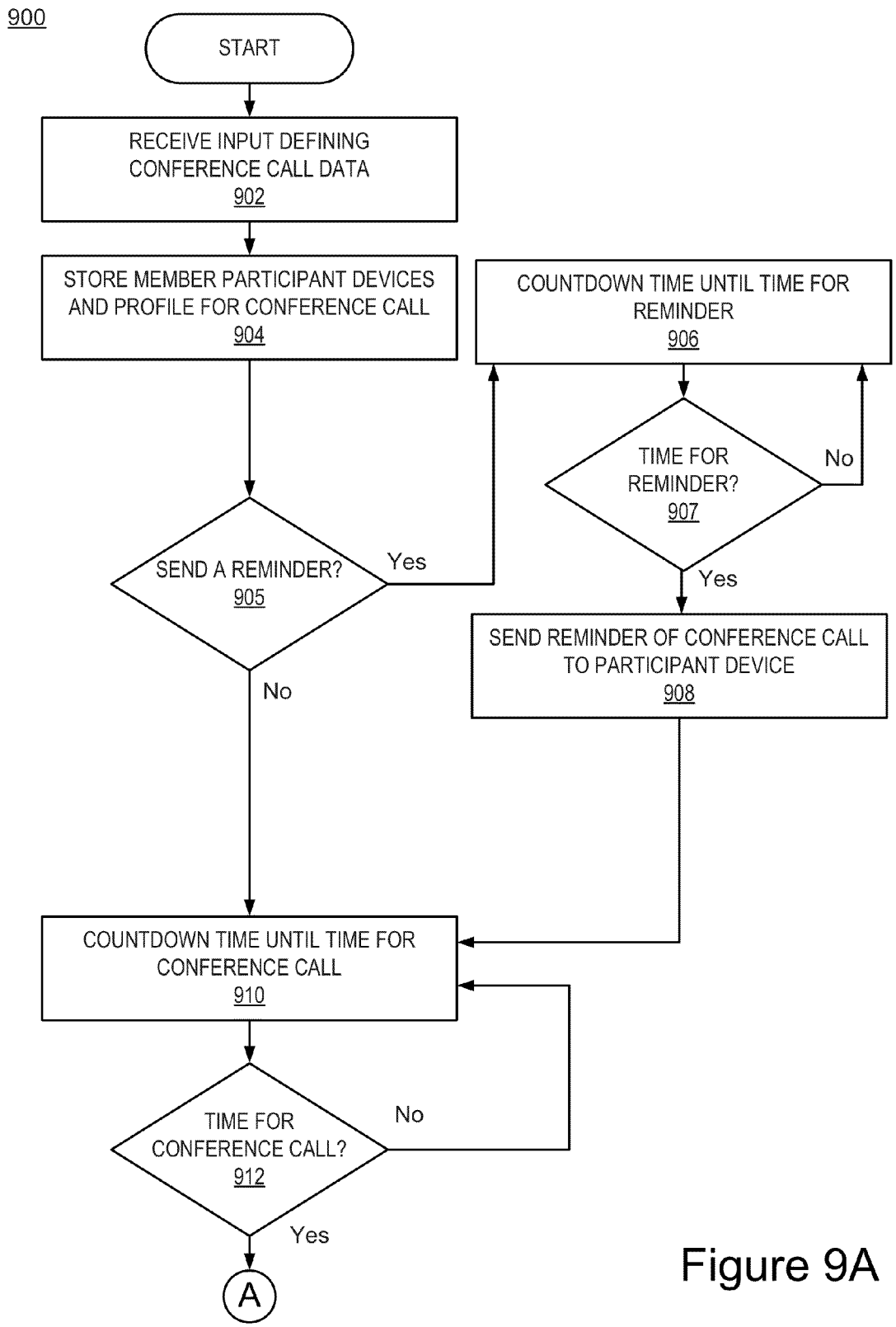
FIGS. 9A, 9B and 9C are a flowchart illustrating a method performed by the reservation module to simulate a conference call according to one embodiment of the present invention.
Figure 9B:
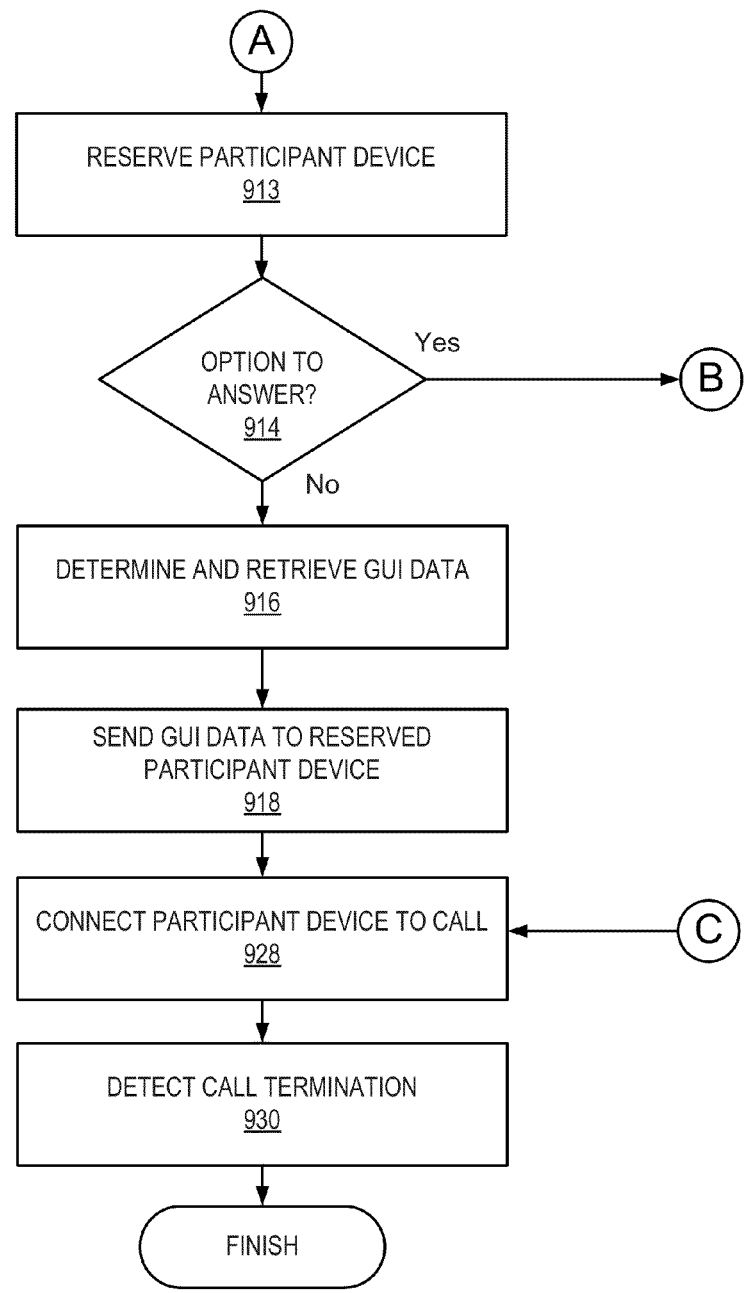
Figure 9C:
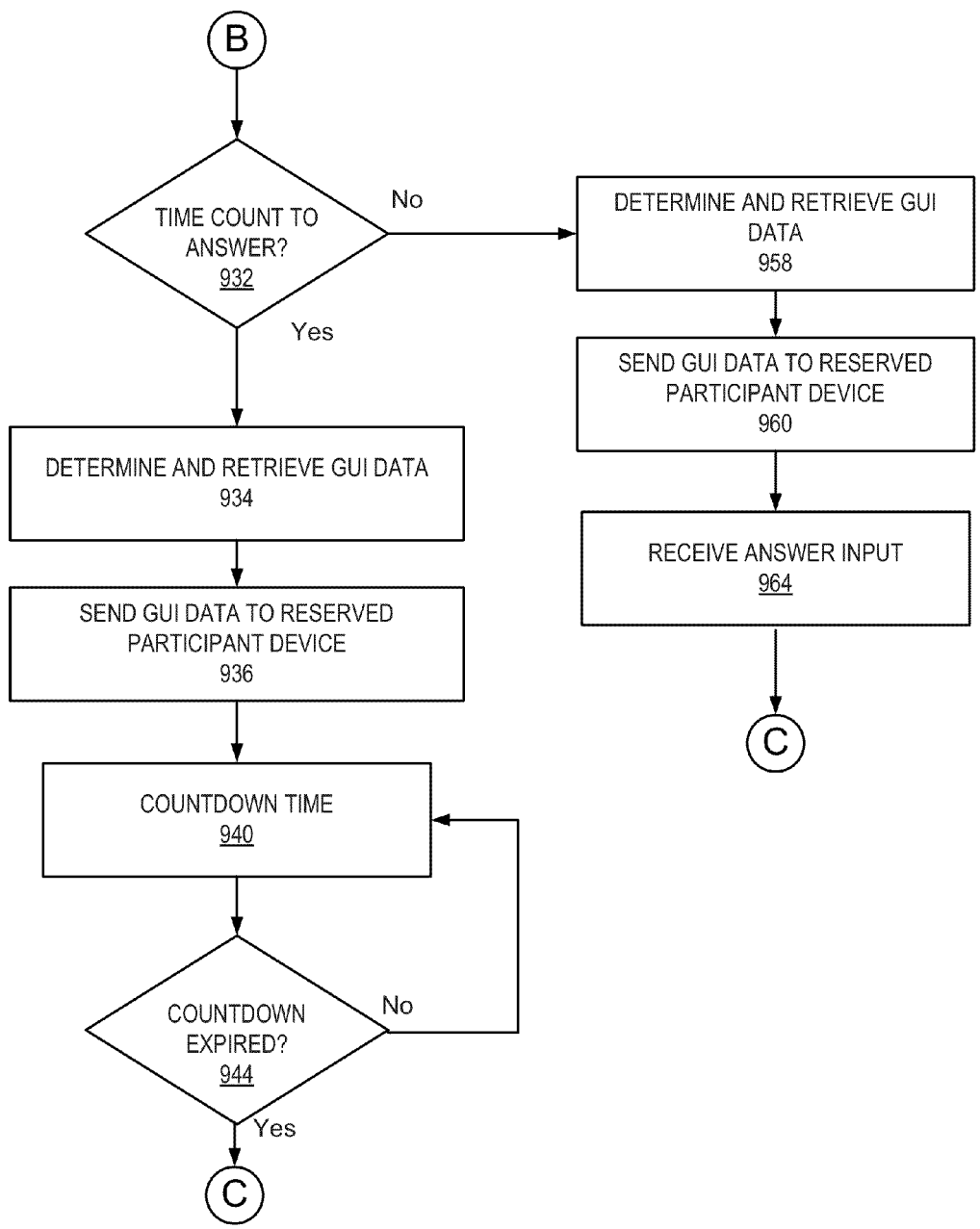

FIGS. 9A, 9B and 9C are a flowchart illustrating a method 900 performed by the reservation module 144 to reserve participant devices for a conference call according to one embodiment of the present invention. A participant device is any hardware device capable of connecting to a conference call as described herein. For example, a participant device is analog phone 121, an IP phone 122, a POT phone 107, a mobile phone 108, a bridge 124 (for instances where the bridge is a hardware bridge 124) or a processor-based hardware device that stores and executes a software phone 123, a bridge 124 (for instances where the bridge 124 is a virtual bridge), an email client 125, a web client 136, an MCM 138 and a PCM 141. In one embodiment, the participant device is located at a site 100 or at any other geographic location. In one embodiment, different participant devices are located at different geographic locations. The user of the participant device is a human referred to herein as a participant. In one embodiment, the participant is not an agent as described above for the agent device. For example, a participant is any human user invited to participate in a conference call (i.e., be a member of a conference call). The GUI module 312 sends a GUI to a display of an endpoint used by an agent to enable the agent to input conference call data. For example, the GUI module 312 sends a GUI similar to the one depicted for FIG. 18A. The reservation module 144 (e.g., the GUI module 312) receives 902 input defining the conference call data (e.g., the time of the conference call, what participant devices will participate in the conference call (who the member participant devices are), whether members get a reminder before the conference call and the time of the reminder, whether members have the option not to participate in the conference call, etc.). The reservation module 144 (e.g., the GUI module 312) stores 904 this data in the configuration data 301. A determination is made at step 905, based on the data collected in step 902, about whether the members of the conference call get a reminder of the conference call. If the determination is "yes," then the method 900 moves to step 906. At step 906 a time count begins counting down the time until the time for the reminder. The predetermined time for the time count is based, for example, on an input received at step 902 specifying the time for the reminder. At step 907 a determination is made regarding whether it is time for the reminder. If the determination is "no," the method 900 moves to step 906 and steps 906 and 907 are repeated. If the determination is "yes," then the method moves to step 908 and the GUI module 312 sends a reminder to the display of the endpoints of the different member participant device. For example, the GUI module 312 sends 908 GUI data to the displays of the member participant device causing a pop up window to be displayed reminding the members of the time of the conference call. The method then moves to step 910 which is described below.

If the determination at step 905 is "no," then the method moves to step 910. At step 910 a time count begins counting down the time until the time for the conference call. A determination is made at step 912 regarding whether it is time for the conference call. If the determination is "no," the method 900 moves to step 910 and steps 910 and 912 are repeated. If the determination is "yes," then the method moves to step 913 described with reference to FIG. 9B.

Turning now to FIG. 9B, at step 913 the monitor module 310 reserves the member participant device to be on a call. At step 914 the GUI module 312 communicates 914 with the configuration data unit 303 to determine if the reserved participant has the option to answer the call to join the conference call. If the reserved participant does not have the option to answer, the method 900 moves to step 916. At step 916 the GUI module 312 determines and retrieves the GUI data for generating GUIs based on one or more of the GUI inputs and the data input at step 902. The GUI module 312 sends 919 the GUI data to the reserved participant devices. For example, the GUI module 312 sends a GUI to the reserved member participant devices. In one embodiment, one or more of the reserved member participant devices are automatically connected to the conference call after a predetermined period of time. The reservation module 144, the ECC 139 and optionally the TAPI 118 communicate 928 with one another to connect the reserved member participant devices to the conference call. The reservation module 144 communicates with one or more of the ECC 139 and the TAPI 118 to determine that the call session has terminated 930 and the method 900 ends.

At step 914 the GUI module 312 determines whether the configuration data provides the reserved member participant device with an option to join the conference call. If the determination at step 914 is "yes," the method 900 moves to FIG. 9C. Turning now to FIG. 9B, at step 932 a determination is made regarding whether a time counter is used to determine when the reserved participant will join the conference call. If the determination at step 932 is "yes," then the method 900 moves to step 934. At step 934 the GUI module 312 determines and retrieves GUI data 934 based on one or more of the GUI inputs and the data collected at step 902. The GUI module 312 sends 936 the GUI data to the reserved participant device. The reservation module 144 begins 940 to countdown to a predetermine period of time until the reserved member participant device is connected on the conference call. For example, the reservation module 144 deducts a time unit from the time counter. The reservation module 144 determines whether the time in the time counter has expired (i.e., whether the predetermined period of time has elapsed). If the determination is "no," the reservation moves to step 940 and the method 900 repeats steps 940 and 944. If the determination at step 944 is "yes," then the method 900 moves to step 928 described above for FIG. 9B.

If the determination at step 932 is "no," then the method moves to step 958. The GUI module 912 determines and retrieves GUI data 958 based on one or more of the GUI inputs and the data collected at step 902. The GUI module 912 sends 960 the GUI data to one or more of the reserved member participant devices. The reservation module 144 receives 964 an input from the reserved participant to answer the conference call and the method 900 proceeds to step 928 described above for FIG. 9B.

In one embodiment, the reservation module 144 (including one or more of the modules 306, 308, 310, 311, 312, 316) is stored in a memory of a conference bridge 124 and executed by a processor of the conference bridge 124. In this embodiment, the conference bridge 124 implements the steps of method 900. In one embodiment, the conference bridge 124 implements the steps of method 900 without communicating with the ECC 139. In one embodiment, the system does not include an ECC 139 and the conference bridge 124 implements the steps of method 900 without communicating with the ECC 139. In one embodiment, step 913 is performed between steps 904 and 905.

In one embodiment, the reservation module 144 operates to provide the functionality of a conference bridge. The reservation module 144 keeps track of the schedule for conference calls and the participants for the conference call. The reservation module 144 performs the steps described above for FIGS. 9A, 9B and 9C to remind participants and set up the conference call. In one embodiment, the PCM 141 generates the GUIs necessary for setting up and/or reminding participants about a scheduled conference call. In one embodiment where the reservation module 144 operates to provide the functionality of a conference bridge, the reservation module 144 does not include a tracking module and/or a queuing module. In this embodiment the reservation module 144 uses the configuration data stored in the storage 140 to store and track conference calls.

Figure 10:
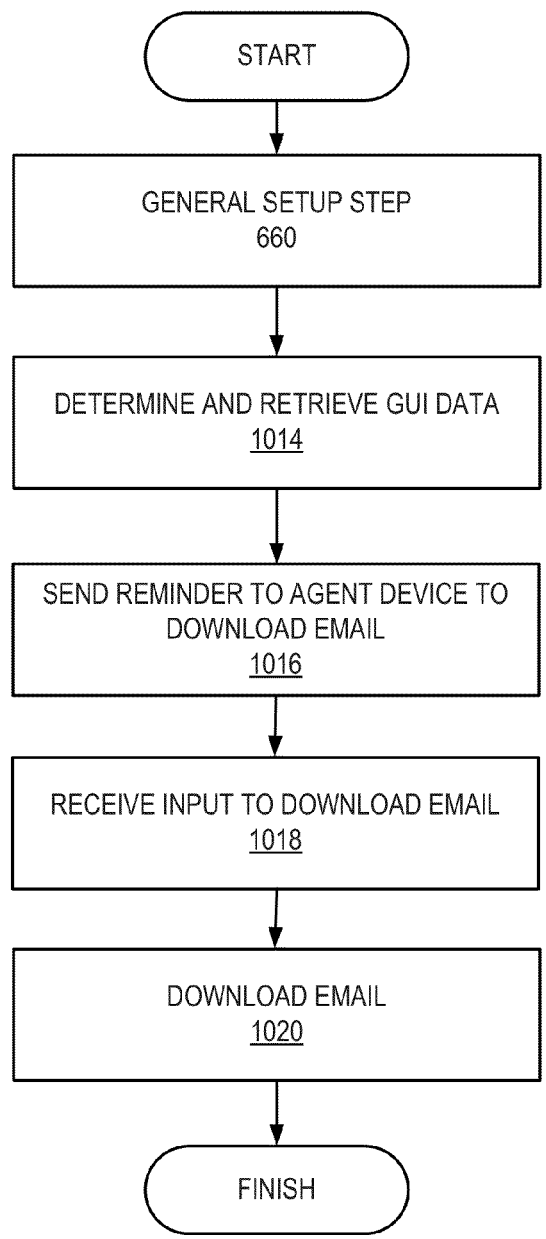
FIG. 10 is a flowchart illustrating a method performed by the reservation module to reserve an agent for an email according to one embodiment of the present invention.
Figure 15:
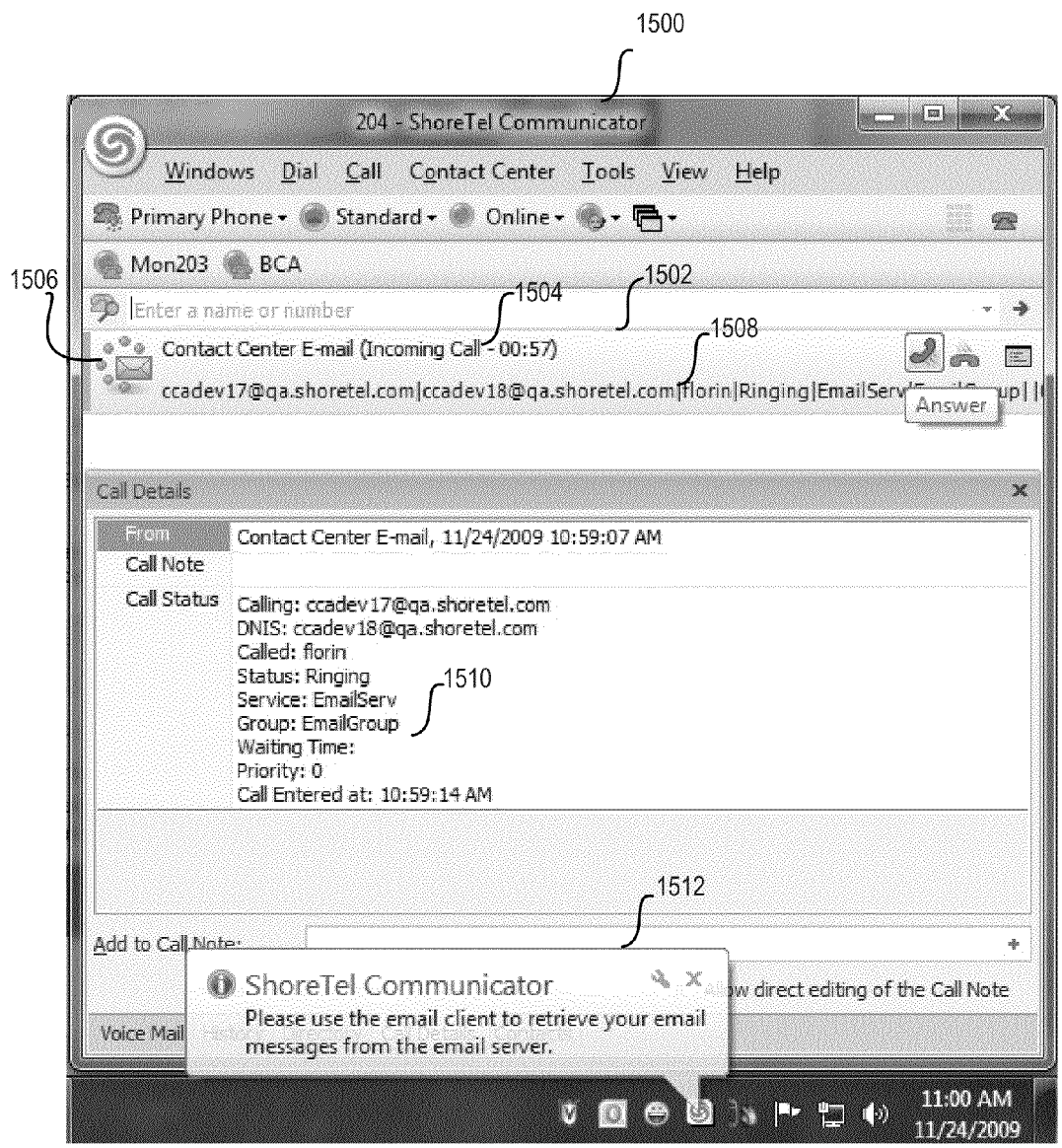
FIG. 15 is a screenshot illustrating a graphical user interface for a simulated email according to one embodiment of the present invention.

FIG. 10 is a flowchart illustrating a method 1000 performed by the reservation module 144 to reserve an agent for an email according to one embodiment of the present invention. The reservation module 144 performs the general setup step described with reference to FIG. 6. The GUI module 312 determines and retrieves 1014 GUI data stored based on one or more of the GUI inputs. The GUI module 312 sends GUI data to a display of the reserved agent that causes the display to depict a GUI having a reminder to the reserved agent to download the email. For example, a GUI similar to the one depicted in FIG. 15 is displayed on the display of the reserved agent (note the reminder in the bottom portion of the GUI). The input module 316 receives an input 1018 from the reserved agent to download the email. The reservation module 316 communicates with an email server (not pictured) to cause the email to be download 1020 to the endpoint used by the reserved agent.

Figure 11:
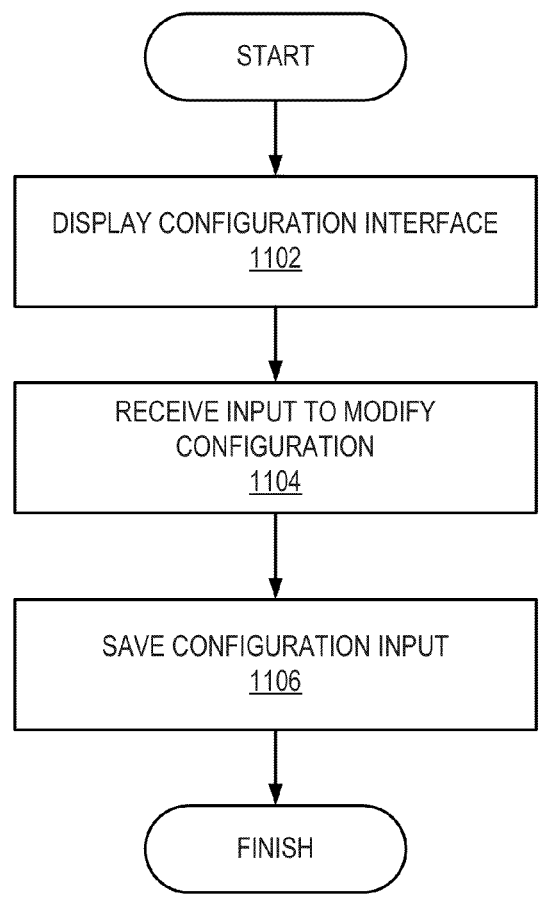
FIG. 11 is a flowchart illustrating a method performed by the reservation module to customize the configuration of a graphical user interface according to one embodiment of the present invention.

FIG. 11 is a flowchart illustrating a method 1100 performed by the reservation module 144 to customize the configuration of a GUI according to one embodiment of the present invention. The GUI module 312 sends data to a display used by an administrator to display 1102 a configuration GUI. For example, the GUI module 312 sends data to cause the display of the configuration GUI depicted in FIG. 16. The GUI module 312 receives the input to modify the configuration data 1104. The GUI module 312 saves the configuration input in the configuration data unit 303.

Figure 12:
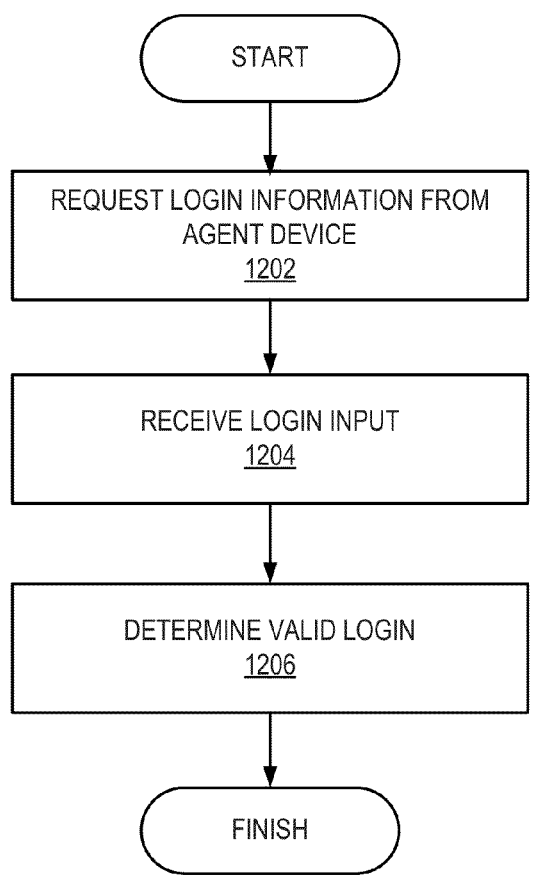
FIG. 12 is a flowchart illustrating a method performed by the reservation module to authenticate an agent device according to one embodiment of the present invention.

FIG. 12 is a flowchart illustrating a method 1200 performed by the reservation module 144 to authenticate an agent device according to one embodiment of the present invention. The login module 316 requests 1202 login information from an agent device. The login module 316 receives the login input 1204. The login module 316 communicates with the login data unit 305 to determine 1206 the validity of the login input. For example, the login module 316 compares the login input received in step 1204 against the login data to determine if the login input includes a user name and password stored in the login data.

Figure 13A:
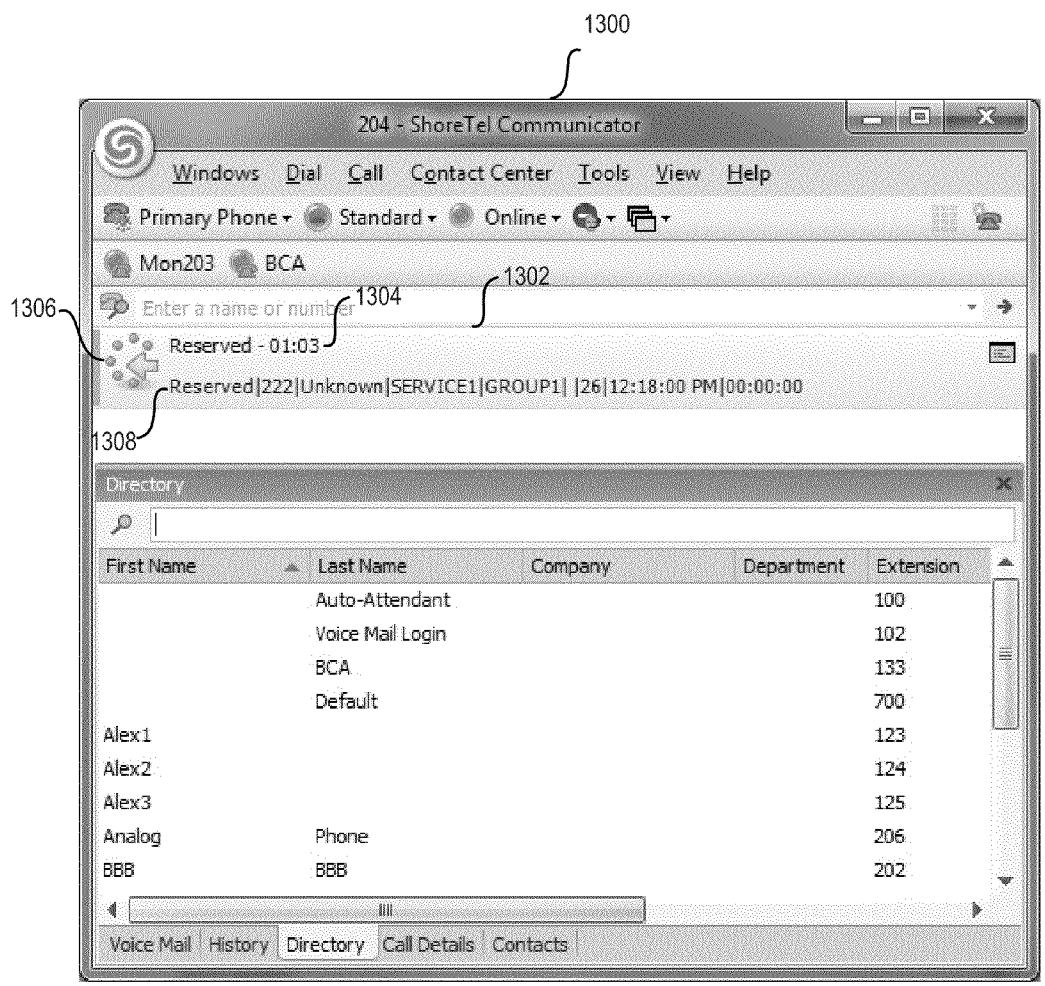
FIGS. 13A and 13C are screenshots illustrating graphical user interfaces for a simulated telephone call according to one embodiment of the present invention.

FIG. 13A depicts a screenshot illustrating a GUI 1300 for a simulated telephone call according to one embodiment of the present invention. The GUI 1300 includes a reservation call cell 1302. Element 1304 is a graphical indication that the call cell is a reserved communicator call cell. For example, the graphical indication 1304 includes the text "Reserved" to indicate that the agent is in a reserved state (i.e., that the agent is a reserved agent). In the depicted embodiment the graphical indication 1304 includes a counter of the elapsed time for which the agent has been in a reserved state. Element 1306 is an icon indicating that the agent device for the reserved agent is in a reserved state. Element 1308 is an ECC call string. The ECC call string includes graphical partitions between different types of data included in the call string 1308. For example, the beginning of the call string states "Reserved|222." The graphic "|" between the data "Reserved" and the data "222" is a graphical partition. The data "Reserved" indicates that the agent device is in a reserved state. The data "222" indicates that there is the Dialed Number Identification Service ("DNIS") number, which is known to those having skill in the art. Accordingly, in the depicted embodiment the reservation call cell 1302 includes: (1) a graphical indication 1304 that the call cell is a reserved communicator call cell; (2) an icon 1306 indicating that the extension for the reserved agent is reserved; and (3) an ECC call string.

In one embodiment, the GUI 1300 disappears if the reservation is canceled. In another embodiment, the call cell 1302 disappears if the reservation is canceled.

Figure 13B:
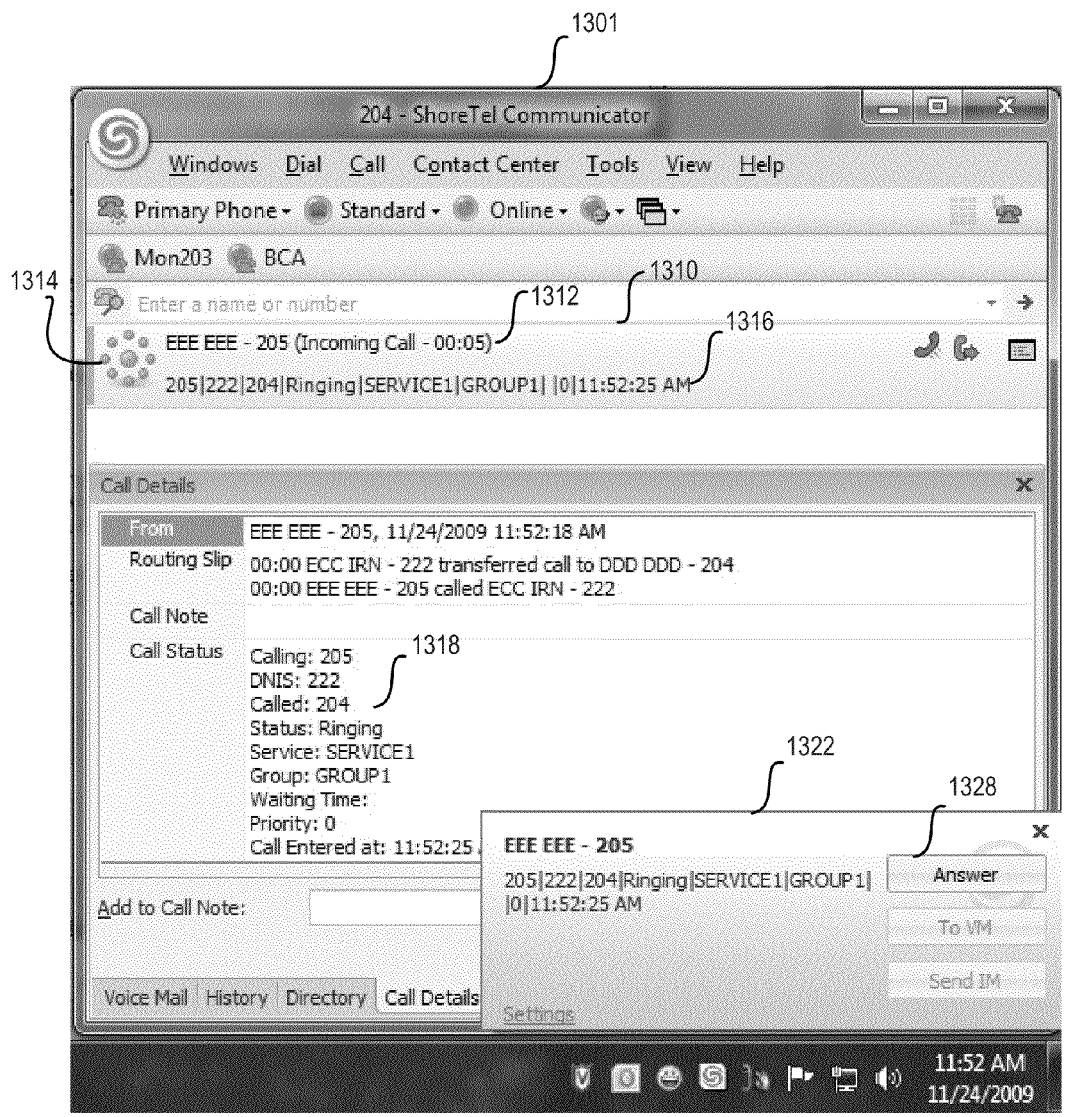
FIG. 13B is a screenshot illustrating a graphical user interface for an incoming call according to one embodiment of the present invention.

FIG. 13B depicts a screenshot illustrating a GUI 1301 for an incoming telephone call according to one embodiment of the present invention. The GUI 1301 includes a connected call cell 1310. In the depicted embodiment, the connected call cell 1310 depicts information for a call that is ongoing (i.e., the agent is no longer in a reserved state). Element 1312 is a graphical indication of an actual incoming TAPI call. Element 1314 is an icon indicating that the agent device has an incoming call. Element 1316 is a call string that includes ECC information and TAPI information (referred to herein as a "combination call string"). Element 1318 is a key to help the agent to understand the combination call string 1316. For example, the combination call string 1316 includes data reading "205." This data is present in the key 1318 to the right of the graphical text reading "Call Status." The key 1318 indicates that "205" is the extension that is calling the agent's extension. Element 1322 is a window that includes a graphical answer button 1328 that the agent can click to answer the call.

In one embodiment, the window 1322 is a call alert window that alerts the agent of the incoming call. In the depicted embodiment the window 1322 includes graphical text of the combination call string. In another embodiment the graphical text of the combination call string is truncated. In the depicted embodiment, the window 1322 includes a first non-clickable button to forward the incoming call to voicemail ("To VM") and a second non-clickable button ("TO IM") that allows a user to send an instant message to the caller of the incoming call, e.g., "I will call you back in 3 minutes." Thus, the agent does not have the option to forward the incoming call to voicemail or instant messaging since these buttons are non-clickable.

Figure 13C:
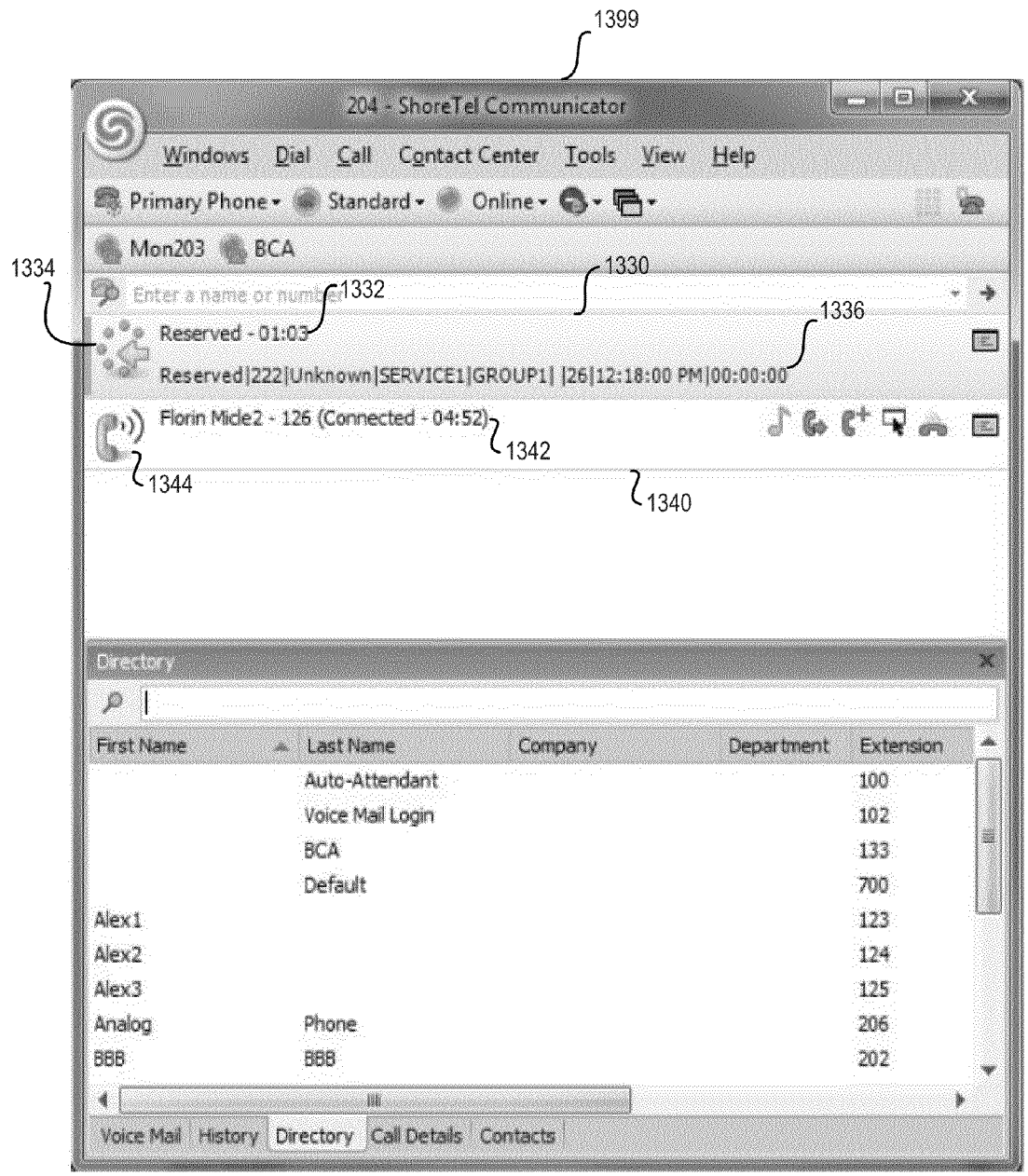

FIG. 13C depicts a screenshot illustrating a GUI 1399 for a simulated telephone call according to one embodiment of the present invention. The GUI 1399 includes two call cells: (1) a reservation call cell 1330; and (2) a concurrent call cell 1340. A concurrent call cell is a call cell for a call that is occurring at the same time as the reserved call (which is represented by the reserved call cell 1330). Although only one concurrent call cell 1340 is depicted in FIG. 13C, in one embodiment more than one concurrent call cell 1340 is included in GUI 1399. For example, the reserved agent is on more than one call at the time of the reserved call. In one embodiment, the cells 1330, 1340 represent different types of communications (i.e., a telephone call, an email, a chat, or a conference call, and/or a reminder or reservation for one or more of these types of communication).

The reserved call cell 1330 includes a graphical indication 1332 that makes it appear to the reserved agent that there is an actual incoming TAPI call when in fact there is not (i.e., an indication 1332 of a virtualized call). Element 1334 is an icon indicating that the agent device has an incoming virtualized call. Element 1336 is a call string that includes ECC information and TAPI information (referred to herein as a "combination call string").

The concurrent call cell 1340 includes a graphical indication depicting an elapsed time for which the reserved agent has been on the call represented by the call cell 1340 (e.g., "Florin Micle2—126 (Connected—04:52)"). In the depicted embodiment, the concurrent call has been ongoing for four minutes and fifty two seconds. Element 1344 is an icon indicating that the agent device has an ongoing call.

In one embodiment, there is a call cell 1330, 1340 for each call the reserved agent is connected to. If the call is a reserved call, then the call cell is a reservation call cell 1330. If the call is not a reserved call, then the call cell is a concurrent call cell 1340 or a similar call cell.

Figure 14A:
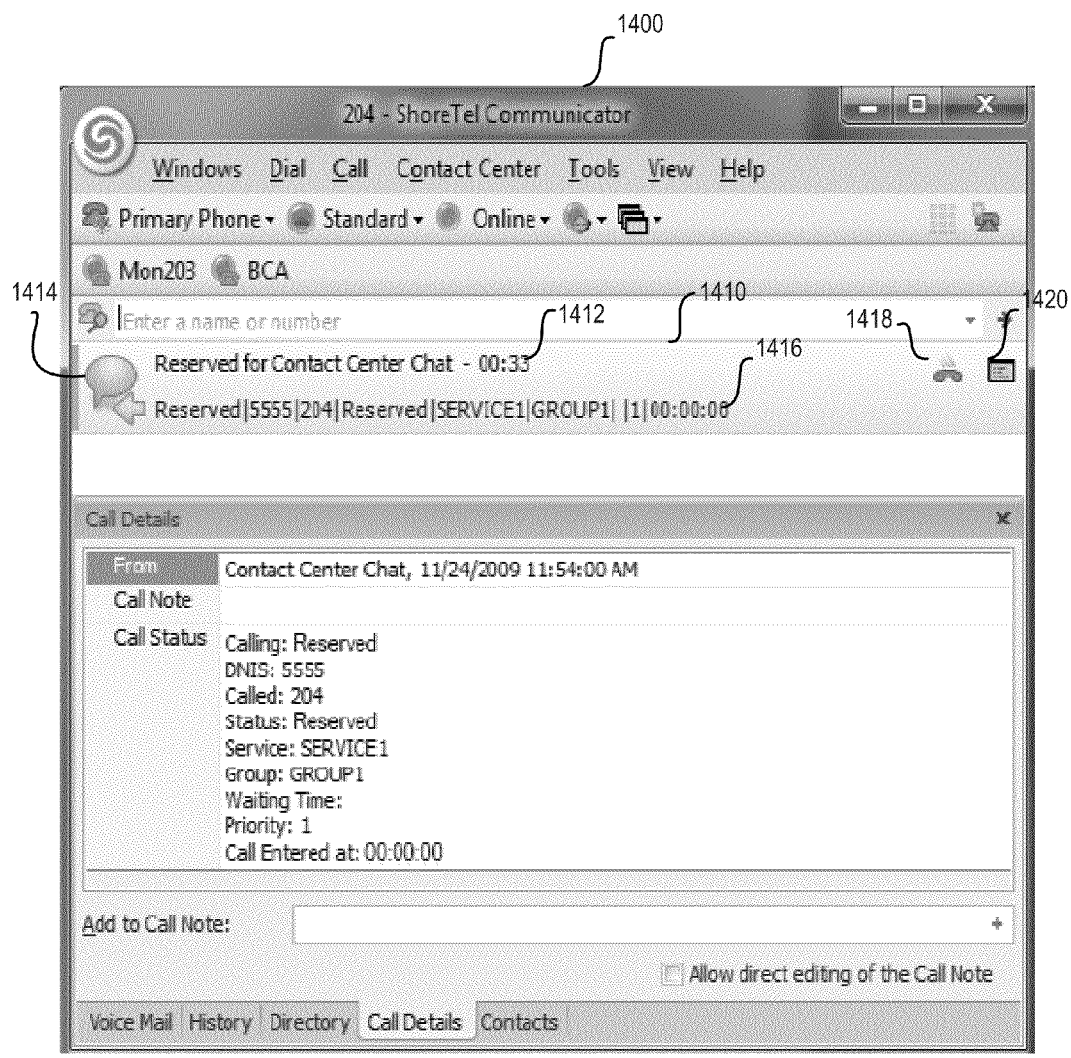
FIG. 14A is a screenshot illustrating a graphical user interface for a simulated chat according to one embodiment of the present invention.

FIG. 14A is a screenshot illustrating a GUI 1400 for a simulated chat according to one embodiment of the present invention. The GUI 1400 includes a reservation call cell 1410. In the depicted embodiment, the reservation call cell 1410 depicts information for a chat session. Element 1412 is a graphical indication indicating that the agent is in a reserved state (i.e., an indication 1412 of a virtualized chat session). For example, the graphical indication 1412 includes the text "Reserved for Contact Center Chat—00:33." Element 1414 is an icon indicating that the agent device is reserved for a pending chat session. Element 1416 is a call string that includes ECC information and TAPI information (referred to herein as a "combination call string") for the virtualized chat session. Element 1418 is an icon that is clickable by the agent to hang-up the call. Thus, controls are displayed directly on the call cell 1410 based upon the operations that the user is allowed to perform for the cell. In this example, the user is allowed to hang up the reservation, i.e., remove themselves from the reserved agents. In an embodiment where they don't have this option this icon would not be present on the cell 1410. Element 1420 is an icon clickable by the agent to request additional information. For example, the agent clicks this button and additional information about the call is provided to the agent.

Figure 14B:
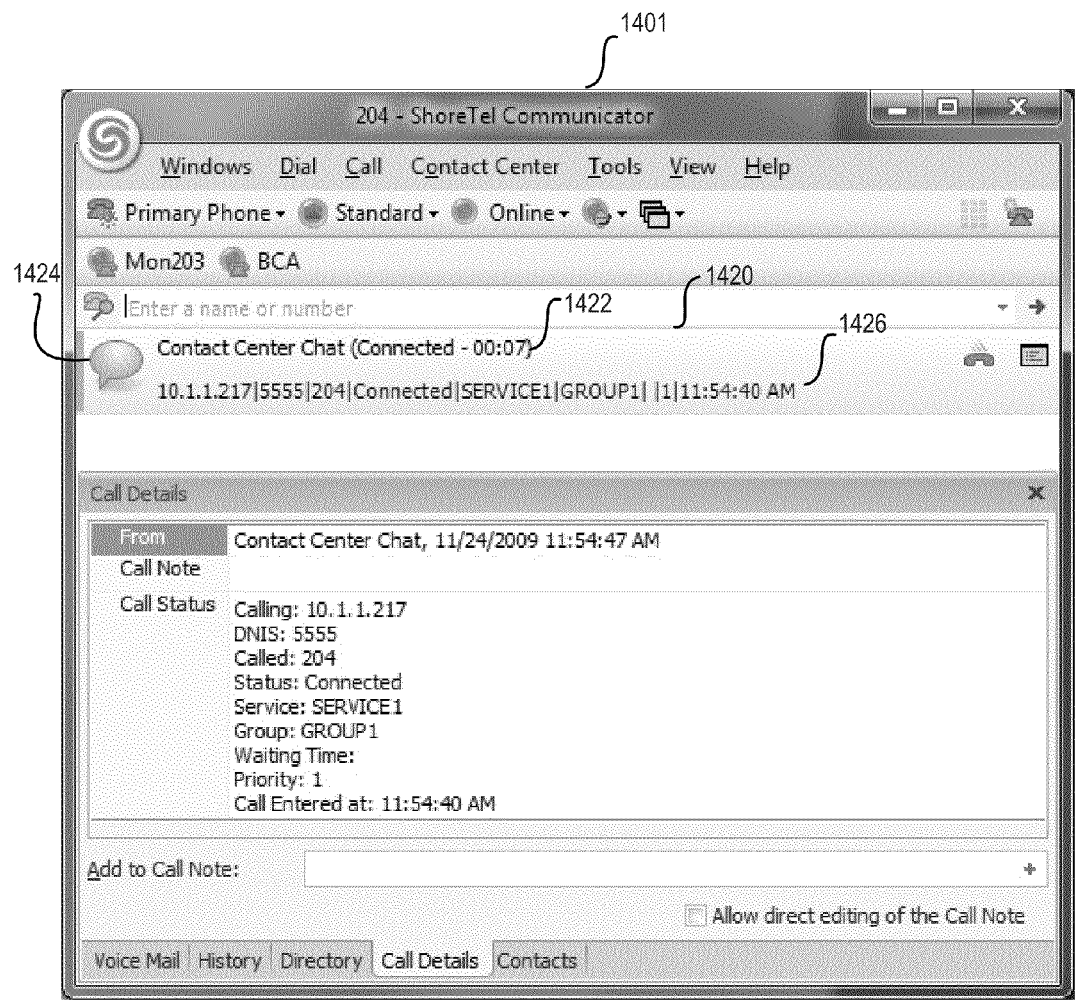
FIG. 14B is a screenshot illustrating a graphical user interface for an actual chat according to one embodiment of the present invention.

FIG. 14B is a screenshot illustrating a GUI 1401 for a chat according to one embodiment of the present invention. The GUI 1401 includes a connected call cell 1420. In the depicted embodiment, the connected call cell 1420 depicts information for a chat session that is ongoing (i.e., the agent is no longer in a reserved state). Element 1422 is a graphical indication that there is an ongoing chat session. For example, the graphical indication 1422 includes the text "Contact Center Chat (Connected—00:07)" to indicate that the agent has been chatting with a third-party user for seven seconds. Element 1424 is an icon indicating that the agent device has an ongoing chat session. Element 1426 is a call string that includes ECC information and TAPI information (referred to herein as a "combination call string") for the ongoing chat session.

FIG. 15 is a screenshot illustrating a GUI 1500 for a simulated email according to one embodiment of the present invention. The GUI 1500 includes a communicator call cell 1502 for an email communication. In one embodiment, the reservation call cell 1502 informs the agent that there are emails that have not been responded to. Element 1504 is a graphical indication that makes it appear to the reserved agent that there is an actual incoming call when in fact there is not (i.e., an indication 1504 of a virtualized call). For example, the graphical indication 1504 includes the text "Incoming Call" to create the appearance of an incoming call. Element 1506 is an icon indicating that the type of communication involved for the incoming call is an email. For example, the icon is an icon of an envelope, which suggests that the type of the communication is an email. Turning back to FIG. 13B, note that this icon 1506 appears different than icon 1314. In one embodiment, these icons 1314, 1506 appear different because they are for different types of virtualized communications (e.g., icon 1314 is an virtualized incoming call and icon 1506 is for an email). Element 1508 is an email string that includes information describing the email. Element 1510 is a key to help the agent to understand the email string 1508 similar to key 1318 described above for FIG. 13B. Element 1512 is a notification bubble reminding the reserved agent to use an email client stored on and executed by the personal computer of the reserved agent to retrieve the email message from the email server (not pictured).

Figure 16:
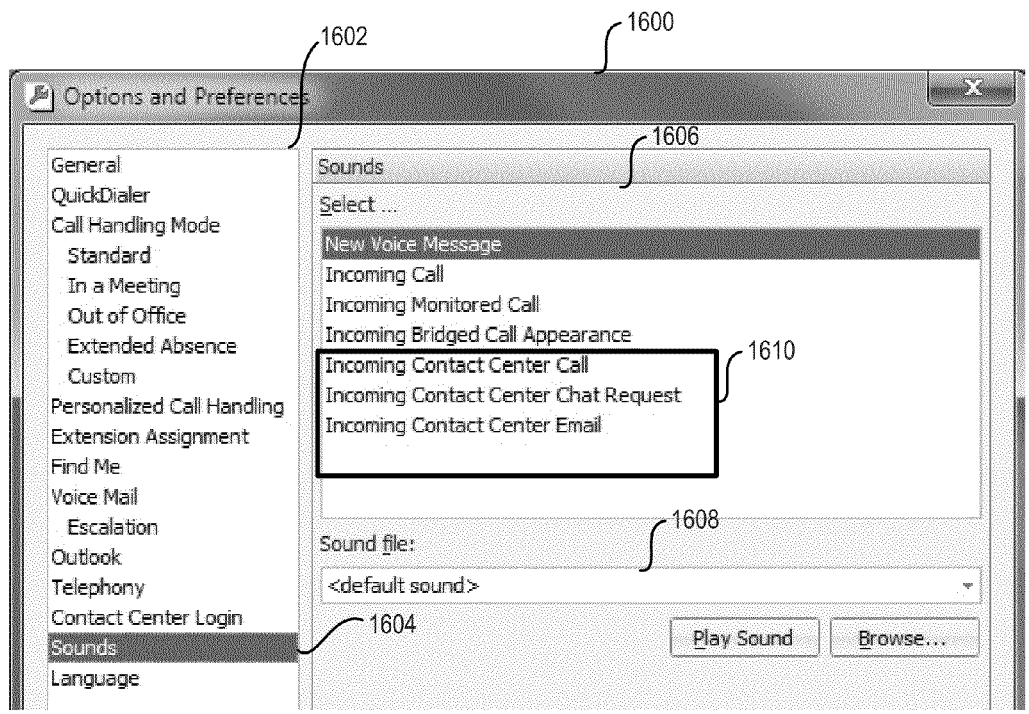
FIG. 16 is a screenshot illustrating graphical user interfaces for configuring the sounds for various call functions according to one embodiment of the present invention.

FIG. 16 is a screenshot illustrating a GUI 1600 for configuring the sounds for various call functions (e.g., "New Voice Message," "Incoming Call," "Incoming Monitored Call," etc.) according to one embodiment of the present invention. Element 1602 is a list of the different categories of features that can be configured using the GUI 1600. For example, the following categories can be configured: (1) general features; (2) the quick dialer; (3) the call handling mode (i.e., how calls are handled when the agent is in a meeting, out of office, away for an extended absence, etc); (4) the personalized call handling; and etc. Included in the categories that can be configured are the sounds 1604. The agent clicks the graphic displaying the word "Sounds" and the section window 1606 for that category is revealed. The agent can select from different subcategories of sounds corresponding to different call functions (e.g., "New Voice Message," "Incoming Call," "Incoming Monitored Call," etc.) and use the sound file field 1608 to configure the sound played for the different subcategories. Element 1610 are categories of sounds indicating communications from the ECC 139. A person having ordinary skill in the art will understand how the categorization GUI 1600 is used to configure different features of the present invention. The inputs provided by the agent are stored as configuration data in the configuration data unit 303.

Figure 17:
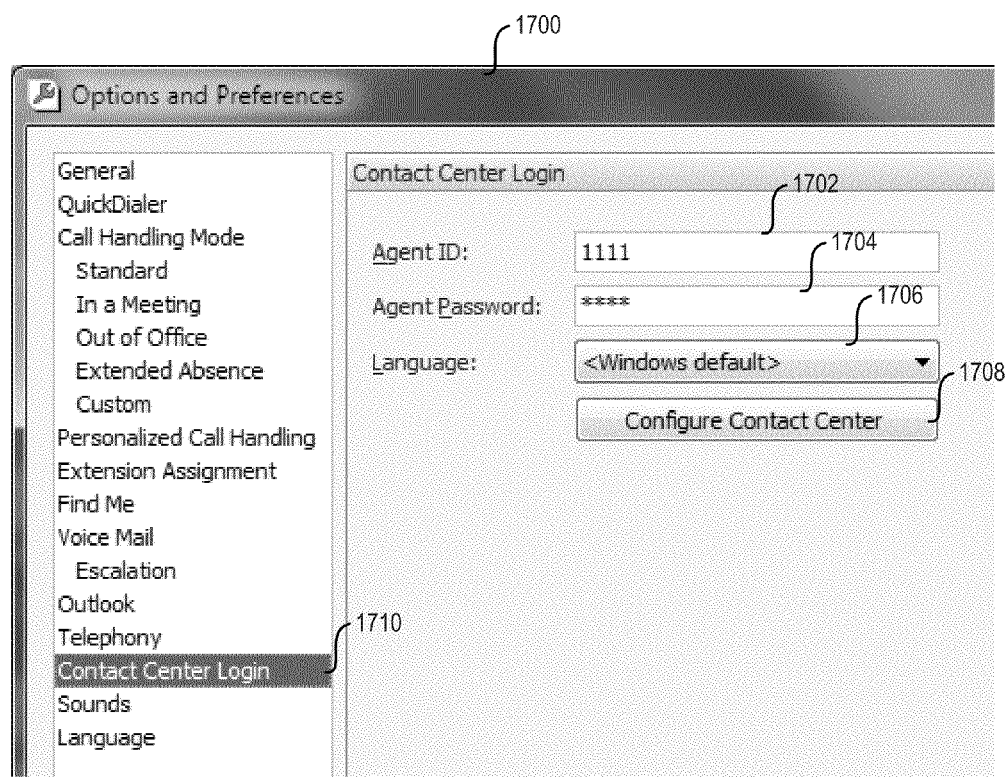
FIG. 17 is a screenshot illustrating a graphical user interface for logging in a agent according to one embodiment of the present invention.

FIG. 17 is a screenshot illustrating a GUI 1700 for authenticating an agent device according to one embodiment of the present invention. Element 1702 is a field for a user to enter an agent ID (similar to a user name). Element 1704 is a field for a user to enter a password. Element 1706 is a dropdown box for a user to select a language. Element 1708 is a graphical button for a user to press to authenticate to the reservation module 144. In the depicted embodiment, the login GUI 1700 is exposed as a category 1710 in a configuration GUI similar to the GUI 1600 described above for FIG. 16.

Figure 18A:
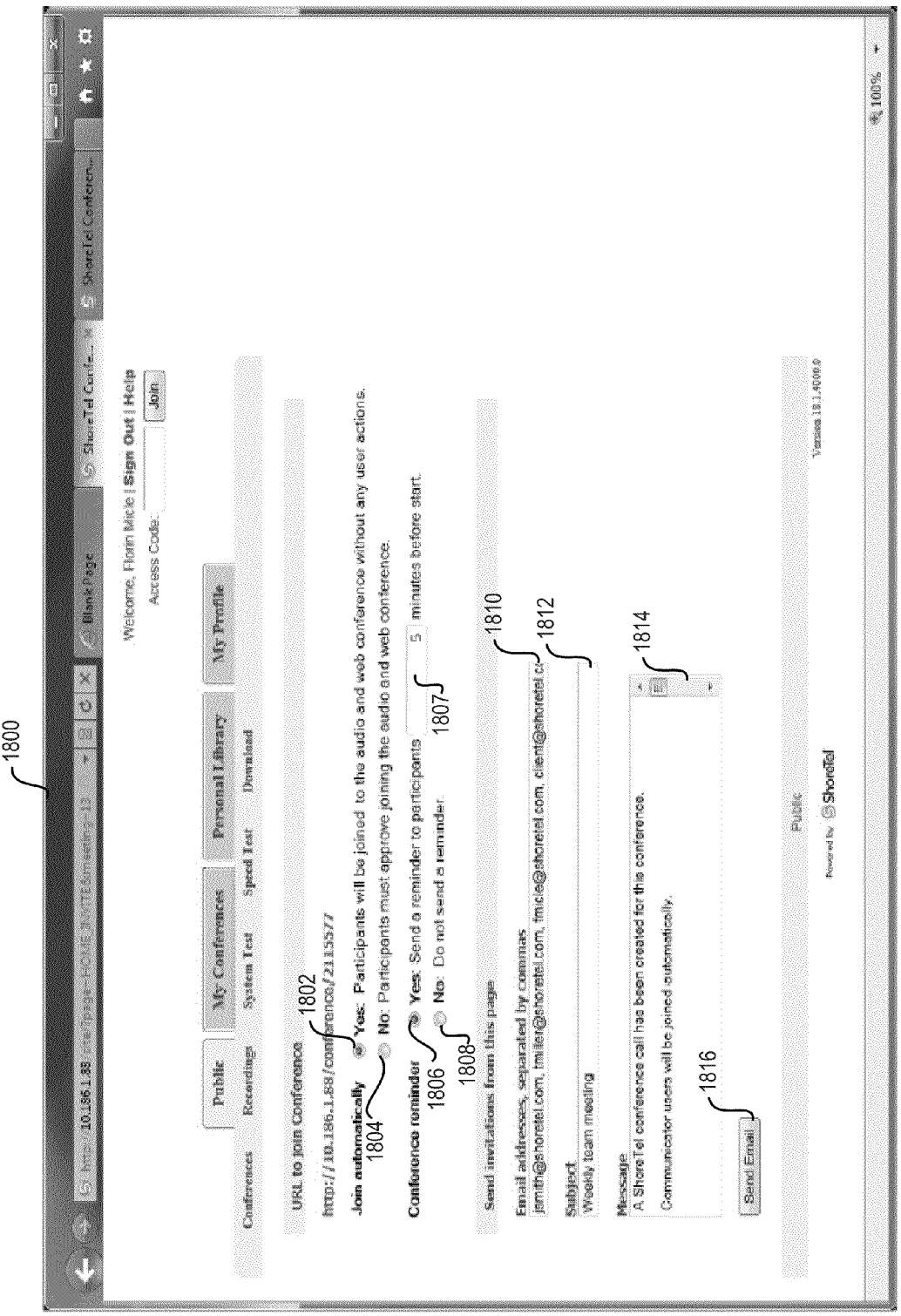
FIG. 18A is a screenshot illustrating a graphical user interface for setting up a conference call according to one embodiment of the present invention.

FIG. 18A is a screenshot illustrating a GUI 1800 for setting up a simulated conference call using one more of the conference bridge 124, reservation module 144 and the ECC 139 according to one embodiment of the present invention. In one embodiment, the reservation module 144 is stored and executed by the conference bridge 124 and the reservation module 144 generates the screenshot depicted in FIG. 18A. In another embodiment, the reservation module 144 is stored and executed by the conference bridge 124 and the conference bridge is integrated in the ECC 139. As described above, members of a conference call are either joined automatically to the conference call or given option to approve joining the conference call. Elements 1802 and 1804 are graphical selection indicators for a user to select whether the members of the conference call will be joined (i.e., connected) automatically to the conference call or given option to approve joining the conference call. If element 1802 is selected by the user, the reservation module 144 joins members of the conference call automatically ("Participants will be joined to the audio and web conference without any user actions."). If element 1804 is selected by the user, the reservation module 144 gives the members of the conference call the option to approve joining the conference call ("Participants must approve joining the audio and web conference.").

In one embodiment, members of the conference call are given a reminder about the conference call. Elements 1806 and 1808 are graphical selection indicators for a user to select whether the members of the conference call receive a reminder of the conference call. If element 1806 is selected by the user, the reservation module 144 sends a reminder to one or more of the participants ("Send a reminder to participants 5 minutes before start."). Element 1807 is a field in which the user specifies a period of time for the reminder. For example, in the depicted embodiment the user has entered "5," and the reservation module 144 will send a reminder to the participants 5 minutes before the start of the conference call. If element 1808 is selected by the user, the reservation module 144 does not send out a reminder to the members of the conference call ("Do not send a reminder.").

Element 1810 is a field in which the user enters one or more email addresses identifying the members of the conference call (e.g., "jsmith@shoretel.com, tmiller@shoretel.com, fmicle@shoretel.com, client@shoretel.com"). The reservation module 144 receives these email address and identifies the users associated with the different email addresses as members of the conference call. In one embodiment, the data entered in field 1810 is stored by the reservation module 144 in the storage 140. In the depicted embodiment, an invitation for the conference call is sent out by the reservation module 144 to each of the email addresses entered by the user. Element 1812 is a field in which the user specifies the subject of the conference call (e.g., "Weekly team meeting"). In one embodiment, the data entered in field 1812 is stored by the reservation module 144 in the storage 140. Element 1814 is a filed in which the user can enter a message to be sent out with the invitation for the conference call (e.g., "A ShoreTel conference call has been created for the conference. Communicator users will be jointed automatically"). In one embodiment, this message is generated automatically by the reservation module 144 responsive to one or more of the user inputs described above with reference to elements 1802, 1804, 1806, 1807, 1808, 1810, 1812. Element 1816 is a graphical button for the user to provide an input indicating to the reservation module 144 to send out the invitations to conference call members specified by element 1810 to participate in the conference call.

In one embodiment, one or more of the user inputs described above with reference to elements 1802, 1804, 1806, 1807, 1808, 1810, 1812 is included as graphical information with a reminder that is sent to a member of the conference call. An embodiment of this is described in further detail below with reference to elements 1818, 1820, 1822 of FIG. 18B.

Figure 18B:
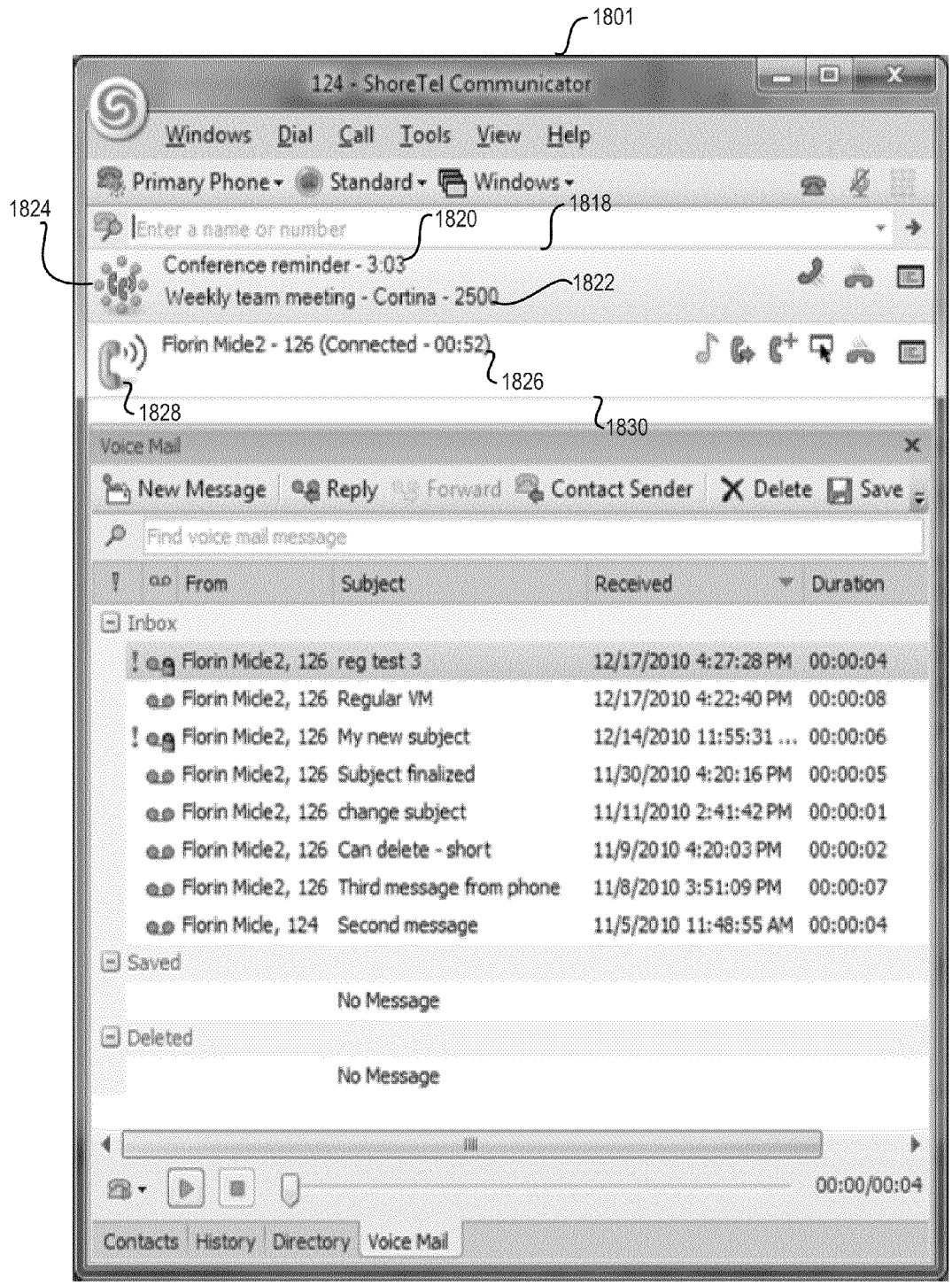
FIG. 18B is a screenshot illustrating a graphical user interface for a conference call reminder according to one embodiment of the present invention.

FIG. 18B is a screenshot illustrating a GUI 1801 for a reminder for a conference call according to one embodiment of the present invention. The GUI 1801 includes two call cells: (1) a reminder call cell 1818; and (2) a concurrent call cell 1830. The reminder call cell 1818 is a reminder of an upcoming conference call. The reservation module 144 generates the reminder call cell 1818 based at least in part on data stored in the storage 140 and sends the reminder to a display used by the user who is a member of the conference call. Element 1820 is a graphical indication includes text indicating that a conference call is upcoming an a countdown of the period of time remaining before the conference call begins (e.g., "Conference reminder—3:03"). In the depicted embodiment, there is three minutes and three seconds remaining before the conference call begins. Element 1822 is a graphical indication that includes text indicating the subject of the conference call ("Weekly team meeting—Cortina—2500"). In this example, the subject of the conference call is "Weekly team meeting," the location of the conference is a conference room called "Cortina" and the extension used for the call is extension "2500." In the depicted embodiment, this text corresponds to text that was entered by the user who scheduled the conference call. For example, refer back to element 1812 of FIG. 18A which includes text reading "Weekly team meeting."

The concurrent call cell 1830 is similar to the concurrent call cell 1340 described above for FIG. 13C. The concurrent call cell 1830 includes a graphical indication depicting an elapsed time for which the reserved agent has been on the call represented by the call cell 1830 (e.g., "Florin Micle2—126 (Connected—00:52)"). In the depicted embodiment, the concurrent call has been ongoing for zero minutes and fifty two seconds. Element 1828 is an icon indicating that the participant device has an ongoing call.

The foregoing description of the embodiments of the present invention has been presented for the purposes of illustration and description. It is not intended to be exhaustive or to limit the present invention to the precise form disclosed. Many modifications and variations are possible in light of the above teaching. It is intended that the scope of the present invention be limited not by this detailed description, but rather by the claims of this application. As will be understood by those familiar with the art, the present invention may be embodied in other specific forms without departing from the spirit or essential characteristics thereof. Likewise, the particular naming and division of the modules, routines, features, attributes, methodologies and other aspects are not mandatory or significant, and the mechanisms that implement the present invention or its features may have different names, divisions and/or formats. Furthermore, as will be apparent to one of ordinary skill in the relevant art, the modules, routines, features, attributes, methodologies and other aspects of the present invention can be implemented as software, hardware, firmware or any combination of the three. Also, wherever a component, an example of which is a module, of the present invention is implemented as software, the component can be implemented as a standalone program, as part of a larger program, as a plurality of separate programs, as a statically or dynamically linked library, as a kernel loadable module, as a device driver and/or in every and any other way known now or in the future to those of ordinary skill in the art of computer programming. Additionally, the present invention is in no way limited to implementation in any specific programming language, or for any specific operating system or environment. Accordingly, the disclosure of the present invention is intended to be illustrative, but not limiting, of the scope of the present invention, which is set forth in the following claims.

What is claimed is:

1. A method for simulating a communication, the method comprising:
   generating simulated communication information, the simulated communication information associated with a virtual communication between a reserved agent and a third party user;
   generating graphical data based at least in part on the simulated communication information, wherein the graphical data creates a visual representation of a simulated call, the simulated call representing a virtualized call that appears to be coming from the third party user and showing an appearance of an ongoing communication between the reserved agent and the third party user that is not yet occurring; and
   sending the graphical data to a display associated with a reserved agent device of the reserved agent so that the display depicts the simulated call.

2. The method of claim 1 further comprising:
   detecting an initial communication with the third party user;
   queuing a contact back event to communicate with the third party user;
   identifying an available agent device to participate in the contact back event;
   reserving the available agent device.

3. The method of claim 1 wherein the simulated communication information is a call string.

4. The method of claim 1, wherein the simulated communication information is generated based at least in part on an enterprise contact center call string received from an enterprise contact center.

5. The method of claim 1, wherein the graphical data is determined based on one or more graphical user interface inputs.

6. The method of claim 5, wherein the graphical user interface inputs are one or more of: (1) graphical user interface data; (2) the simulated communication information; (3) queue data; (4) configuration data; (5) an enterprise contact center call string; and (6) a telephony application programming interface notification.

7. The method of claim 1, wherein the graphical data includes one or more of: (1) a reserved communicator call cell; (2) a graphical indication that is clickable by the reserved agent that is a user of the reserved agent device to participate in a contact back event; (3) a graphical indication that is clickable by the reserved agent to decline to participate in the contact back event; (4) a key to allow the reserved agent to understand a combination call string included in the reserved communicator call cell; and (5) a notification bubble reminding the reserved agent to retrieve an email message.

8. The method of claim 1, wherein the graphical data includes a reserved communicator call cell that includes one or more of: (1) an icon to indicate the reserved agent device is in a reserved state; (2) an icon to indicate a form of a connection; (3) a communicator call string; (4) an icon to indicate that the reserved agent that is a user of the reserved agent device has an option to participate in a contact back event; and (5) an icon to indicate that the reserved agent does not have an option to participate in the contact back event.

9. The method of claim 2, wherein the initial communication is one of a telephone call, an email, a chat and a conference call.

10. The method of claim 2, wherein the contact back event is one of a telephone call, an email, a chat and a conference call.

11. The method of claim 1, wherein the simulated communication is depicted by a first call cell that is displayed concurrent with a second call cell depicting an active communication.

12. A system for simulating a communication, the system comprising:
- a reservation module stored on a memory and communicatively coupled to a reserved agent device, the reservation module configured to:
  - generate simulated communication information, the simulated communication information associated with a virtual communication between a reserved agent and a third party user;
  - generate graphical data based at least in part on the simulated communication information, wherein the graphical data creates a visual representation of a simulated call, the simulated call representing a virtualized call that appears to be coming from the third party user and showing an appearance of an ongoing communication between the reserved agent and the third party user that is not yet occurring; and
  - send the graphical data to a display associated with the reserved agent device of the reserved agent so that the display depicts the simulated call.

13. The system of claim 12 further comprising:
- a tracking module communicatively coupled to the reservation module, and configured to detect an initial communication with the third party user;
- a queue module communicatively coupled to the tracking module and the reservation module, the queue module configured to queue a contact back event to communicate with the third party user;
- a monitor module communicatively coupled to the tracking module, the queue module and the reservation module, the monitor module configured to identify an available agent device to participate in the contact back event and reserve the available agent device.

14. The system of claim 12, wherein the simulated communication information is a call string.

15. The system of claim 12, wherein the simulated communication information is generated based at least in part on an enterprise contact center call string received from an enterprise contact center.

16. The system of claim 12, wherein the graphical data is determined based on one or more graphical user interface inputs.

17. The system of claim 16, wherein the graphical user interface inputs are one or more of: (1) graphical user interface data; (2) the simulated communication information; (3) queue data; (4) configuration data; (5) an enterprise contact center call string; and (6) a telephony application programming interface notification.

18. The system of claim 12, wherein the graphical data includes one or more of: (1) a reserved communicator call cell; (2) a graphical indication that is clickable by the reserved agent that is a user of the reserved agent device to participate in a contact back event; (3) a graphical indication that is clickable by the reserved agent to decline to participate in the contact back event; (4) a key to allow the reserved agent to understand a combination call string included in the reserved communicator call cell; and (5) a notification bubble reminding the reserved agent to retrieve an email message.

19. The system of claim 12, wherein the graphical data includes a reserved communicator call cell that includes one or more of: (1) an icon to indicate the reserved agent device is in a reserved state; (2) an icon to indicate a form of a connection; (3) a communicator call string; (4) an icon to indicate that the reserved agent that is a user of the reserved agent device has an option to participate in a contact back event; and (5) an icon to indicate that the reserved agent does not have an option to participate in the contact back event.

20. The system of claim 13, wherein the initial communication is one of a telephone call, an email, a chat and a conference call.

21. The system of claim 13, wherein the contact back event is one of a telephone call, an email, a chat and a conference call.

22. The system of claim 12, wherein the simulated communication is depicted by a first call cell that is displayed concurrent with a second call cell depicting an active communication.

* * * * *